US009601216B2

(12) United States Patent
Ryu et al.

(10) Patent No.: US 9,601,216 B2
(45) Date of Patent: Mar. 21, 2017

(54) SEMICONDUCTOR DEVICE INCLUDING REDUNDANCY CELL ARRAY

(71) Applicant: Samsung Electronics Co., Ltd., Suwon-si (KR)

(72) Inventors: Je-Min Ryu, Seoul (KR); Ho-Young Song, Hwaseong-si (KR); Yun-Young Lee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/970,983

(22) Filed: Dec. 16, 2015

(65) Prior Publication Data

US 2016/0189800 A1 Jun. 30, 2016

(30) Foreign Application Priority Data

Dec. 26, 2014 (KR) ........................ 10-2014-0190433

(51) Int. Cl.
*G11C 29/40* (2006.01)
*G11C 29/04* (2006.01)
(Continued)

(52) U.S. Cl.
CPC ............ *G11C 29/40* (2013.01); *G11C 17/143* (2013.01); *G11C 17/16* (2013.01); *G11C 17/18* (2013.01); *G11C 29/04* (2013.01); *G11C 29/76* (2013.01); *G06F 11/006* (2013.01); *G11C 8/10* (2013.01); *G11C 17/00* (2013.01)

(58) Field of Classification Search
CPC ......... G11C 29/40; G11C 29/04; G11C 29/76; G11C 8/10; G11C 17/16; G11C 17/00; G06F 11/006
See application file for complete search history.

(56) References Cited

U.S. PATENT DOCUMENTS 5,970,002 A * 10/1999 Yoo ........................ G11C 29/80
365/200
5,999,463 A 12/1999 Kim et al.
(Continued)

FOREIGN PATENT DOCUMENTS

KR 10-0256820 B1 2/2000
KR 10-0295047 B1 4/2001
(Continued)

*Primary Examiner* — Richard Elms
*Assistant Examiner* — Ajay Ojha
(74) *Attorney, Agent, or Firm* — Muir Patent Law, PLLC

(57) ABSTRACT

Provided is a semiconductor device and a manufacturing method thereof. The semiconductor device may include a first cell array, a first fuse circuit, a first spare cell array, a second spare cell array, and a redundancy select controller. The first fuse circuit may be configured to store a first failed address corresponding to one or more defective memory cells in the first cell array. Each of the first and second spare cell arrays may include a plurality of spare memory cells configured to replace first and second defective memory cells in the first cell array, respectively. For replacing the first and second defective memory cells, the redundancy select controller may be configured to selectively assign the first fuse circuit to either one or both of the first and second spare cell arrays.

20 Claims, 17 Drawing Sheets

(51) Int. Cl.
*G11C 29/00* (2006.01)
*G11C 17/16* (2006.01)
*G11C 17/14* (2006.01)
*G11C 17/18* (2006.01)
*G11C 8/10* (2006.01)
*G06F 11/00* (2006.01)
*G11C 17/00* (2006.01)

(56) References Cited

U.S. PATENT DOCUMENTS

| | | |
|---|---|---|
| 6,084,807 A | 7/2000 | Choi |
| 6,118,712 A | 9/2000 | Kim et al. |
| 6,856,569 B2 | 2/2005 | Nelson et al. |
| 7,116,591 B2 | 10/2006 | Min et al. |
| 7,362,629 B2 | 4/2008 | Lee |
| 7,602,659 B2 | 10/2009 | Kang |
| 8,737,146 B2 | 5/2014 | Kim et al. |
| 2007/0014167 A1* | 1/2007 | Lee ........................ G11C 29/24 365/200 |
| 2009/0282301 A1* | 11/2009 | Flynn .................... G06F 11/006 714/710 |
| 2012/0195144 A1* | 8/2012 | Ide ........................ G11C 29/40 365/200 |
| 2013/0215662 A1* | 8/2013 | Lim ....................... G11C 17/00 365/94 |
| 2014/0198593 A1* | 7/2014 | Kwon ................... G11C 29/04 365/200 |
| 2014/0241085 A1* | 8/2014 | Ryu ....................... G11C 29/04 365/200 |

FOREIGN PATENT DOCUMENTS

| | | |
|---|---|---|
| KR | 10-2002-0041549 A | 6/2002 |
| KR | 10-2007-0038672 A | 4/2007 |
| KR | 10-2008-0063874 A | 7/2008 |
| KR | 10-2008-0101149 A | 11/2008 |

* cited by examiner

1400

SEMICONDUCTOR DEVICE INCLUDING REDUNDANCY CELL ARRAY

CROSS-REFERENCE TO RELATED APPLICATION

This application claims priority under 35 U.S.C. §119 to Korean Patent Application No. 10-2014-0190433 filed on Dec. 26, 2014, in the Korean Intellectual Property Office, the entire contents of which are herein incorporated by reference.

BACKGROUND

1. Field of the Inventive Concept

Embodiments of the present disclosure described herein relate to a semiconductor device and a manufacturing method thereof.

2. Description of the Related Art

In general, semiconductor memory devices, including a dynamic random access memory (DRAM), may each be provided with a plurality of banks. Each of the banks may be provided with a large number of memory cells, each of them including cell transistors and cell capacitors. Defects may occur in the plurality of these memory cells for several reasons. In the case of a defect, the corresponding semiconductor memory device is treated as a defective product because it may not perform a memory function.

Meanwhile, under circumstances in which the integration density of a semiconductor memory device is gradually increased, the probability that defects will occur in a small amount of cells is typically increased. A method of treating and discarding the whole semiconductor memory device including the small amount of these defective cells as a defective product may be an inefficient treatment method of decreasing the yield of a product.

Accordingly, a method of enhancing the yield of the product by having a separate memory cell in a semiconductor memory device and replacing a defective cell with the memory cell is usually used. In other words, after a spare memory cell is made and tested in advance, when a defect occurs in a memory cell, the memory cell in which the defect occurs is repaired with the spare memory cell to address a problem in which a chip does not operate normally. Herein, the spare memory cell is referred to as a redundancy cell and a circuit which intervenes in this repair operation is referred to as a redundancy circuit.

The more redundancy cells, the more the yield of the product is increased. However, there may result in a burden to a chip size due to fuse portions which are increased according to this. Therefore, it would be useful to provide a method of minimizing the number of fuse portions and improving the yield of the product.

SUMMARY

Embodiments of the present disclosure provide a semiconductor device for minimizing the waste of fuse portions and solving a plurality of defects which may occur in one or more defective cells to be repaired through a redundancy memory cell array by changing a fuse portion corresponding to the redundancy memory cell array to another fuse portion, or dividing a plurality of spare memory cells in the redundancy memory cell array and sharing the divided plurality of spare memory cells in the redundancy memory cell array with anther fuse portion.

According to certain aspects of the inventive concept may provide a semiconductor device. The semiconductor device may include a first cell array, a plurality of redundancy cell arrays, a plurality of fuse portions, and a redundancy select controller. The first cell array may include a plurality of memory cells. Each of the plurality of redundancy memory cell arrays may include a plurality of spare memory cells for replacing one or more defective memory cells in the first cell array. Each of the plurality of fuse portions may be configured to store a failed address corresponding to the one or more defective memory cells. The redundancy select controller may be configured to selectively assign each one of the fuse portions to each one of the redundancy cell arrays, respectively.

According to certain aspects of the inventive concept may provide a semiconductor device. The semiconductor device may include a first cell array, a first fuse circuit, a first spare cell array, a second spare cell array, and a redundancy select controller. The first cell array may include a plurality of memory cells arranged in a plurality of rows and columns. The first fuse circuit may be configured to store a first failed address corresponding to one or more defective memory cells in the first cell array. The first spare cell array may include a plurality of spare memory cells configured to replace a first defective memory cell in the first cell array. The second spare cell array may include a plurality of spare memory cells configured to replace a second defective memory cell in the first cell array. For replacing the first and second defective memory cells, the redundancy select controller may be configured to selectively assign the first fuse circuit to either one or both of the first and second spare cell arrays.

According to certain aspects of the inventive concept may provide a semiconductor device. The semiconductor device may include a first cell array, a plurality of fuse circuits, a plurality of spare cell arrays, and a redundancy select controller. The first cell array may include a plurality of memory cells arranged in a plurality of rows and columns. Each of the plurality of fuse circuits may be configured to store a failed address corresponding to a defective memory cell in the first cell array. Each of the plurality of spare cell arrays may include a plurality of spare memory cells configured to replace the respective defective memory cell. The plurality of spare memory cells of each of the spare cell arrays may be arranged in a first column or in a first row and divided into n subsets of spare memory cells, n is a positive integer. The redundancy select controller may be configured to selectively assign each of the fuse circuits to a corresponding subset of spare memory cells of the n subsets of spare memory cells, respectively.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION OF THE EMBODIMENTS

Figure 1:
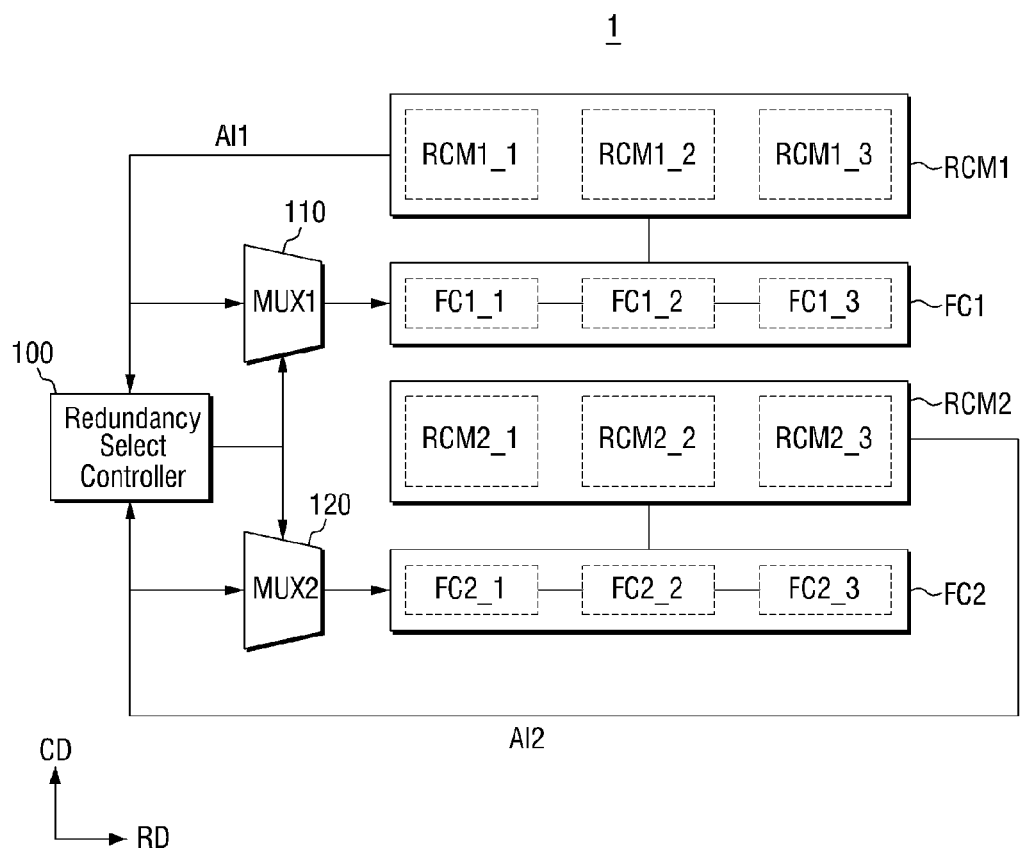
FIG. 1 is a block diagram illustrating a configuration of a semiconductor device according to example embodiments of the inventive concept.

Embodiments of the present disclosure will be described in detail with reference to the accompanying drawings. The inventive concept, however, may be embodied in various different forms, and should not be construed as being limited only to the illustrated embodiments. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. Unless indicated otherwise, these terms are only used to distinguish one element, component, region, layer or section from another element, component, region, layer or section. Thus, a first element, component, region, layer or section discussed below could be termed a second element, component, region, layer or section without departing from the teachings of the inventive concept. Expressions such as "at least one of," when preceding a list of elements, modify the entire list of elements and do not modify the individual elements of the list unless the context indicates otherwise.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Hereinafter, a description will be given for a semiconductor device according to example embodiments of the inventive concept with reference to FIGS. 1 to 5.

FIG. 1 is a block diagram illustrating a configuration of a semiconductor device according to example embodiments of the inventive concept. FIGS. 2 to 5 are drawings illustrating corresponding relations between fuse portions and redundancy memory arrays of FIG. 1 according to example embodiments.

Prior to explanations of FIG. 1, a description will be given for a short process of repairing a defective cell in a memory cell array (not shown) (hereinafter, referred to as a normal cell array).

A repair algorithm which may repair a defective cell is classified into a row repair method and a column repair method. The row repair method is a method of repairing a row line including a defective cell with a redundancy row memory cell (or, a spare row memory cell). The column repair method is a method of repairing a column line including a defective cell with a redundancy column memory cell (or, a spare column memory cell).

In the two methods, an address corresponding to a line (hereinafter, referred to as a defective cell line) including a defective cell is programmed in a fuse. Accessing a defective cell in a read and write operation from and in a normal cell array, a processor compares the state programmed in the fuse with an input address (for example, an address of a target of a read and write operation) and access a redundancy memory cell instead of the defective cell.

Herein, methods of programming the address in the fuse may include an electric fuse method of melting and cutting a fuse using an over-current, a method of burning and cutting the fuse using a laser beam, and a method of short-circuiting a junction using a laser beam, etc.

Referring to FIG. 1, the semiconductor device 1 according to example embodiments of the inventive concept may include first and second redundancy memory blocks RCM1 and RCM 2, first and second fuse blocks FC1 and FC2, a redundancy select controller 100, and first and second multiplexers 110 and 120.

For example, the semiconductor device 1 may correspond to an exemplary embodiment driven according to a column selection line (CSL) (not shown). Accordingly, hereinafter, the first and second redundancy memory blocks RCM1 and RCM 2 are referred to as first and second redundancy column memory blocks, respectively. Also, the first and second fuse blocks FC1 and FC2 are referred to as first and second column fuse blocks, respectively.

The first redundancy column memory block RCM1 may include a plurality of redundancy column memory cell arrays RCM1_1 to RCM1_3. Also, the second redundancy column memory block RCM2 may include a plurality of redundancy column memory cell arrays RCM2_1 to RCM2_3.

In more detail, the first redundancy column memory block RCM1 may include a spare memory cell for preparing a normal cell array (not shown) for being repaired, for example, for repairing a defective cell in the normal cell array, and may also include a plurality of spare memory cells.

In certain embodiments, a plurality of spare memory cells in each of the redundancy column memory cell arrays RCM1_1 to RCM1_3 and RCM2_1 to RCM2_3 may be arranged in one column line.

FIG. 1 illustrates that the first redundancy column memory block RCM1 includes three redundancy column memory cell arrays, but is not limited thereto. For example, the first redundancy column memory block RCM1 may include redundancy column memory cell arrays which are greater or less than the three redundancy column memory cell arrays.

Also, the second redundancy column memory block RCM2 may include a spare memory cell for preparing the normal cell array for being repaired, that is, for repairing a defective cell in the normal cell array, and may also include a plurality of spare memory cells.

FIG. 1 illustrates that the second redundancy column memory block RCM1 includes three redundancy column memory cell arrays, but is not limited thereto. For example, the second redundancy column memory block RCM2 may include redundancy column memory cell arrays which are greater or less than the three redundancy column memory cell arrays.

The first column fuse block FC1 may include a plurality of column fuse portions FC1_1 to FC1_3. Also, the second column fuse block FC2 may include a plurality of column fuse portions FC2_1 to FC2_3.

In more detail, the first column fuse block FC1 may correspond to the first redundancy column memory block RCM1. An address of a defective cell in the normal cell array, that is, a column address of the defective cell may be programmed in each of the column fuse portions FC1_1 to FC1_3.

FIG. 1 illustrates that the first column fuse block FC1 includes three column fuse portions FC1_1 to FC1_3, but is not limited thereto. For example, the first column fuse block FC1 may include column fuse portions which are greater or less than three column fuse portions FC1_1 to FC1_3.

Also, the second column fuse block FC2 may correspond to the second redundancy column memory block RCM2. An address of a defective cell in the normal cell array, that is, a column address of the defective cell may be programmed in each of the column fuse portions FC2_1 to FC2_3.

FIG. 1 illustrates that the second column fuse block FC2 includes three column fuse portions FC2_1 to FC2_3, but it is not limited thereto. For example, the second column fuse block FC2 may also include column fuse portions which are greater or less than three column fuse portions.

The redundancy select controller 100 may change one column fuse portion corresponding to each of the first and second redundancy column memory blocks RCM1 and RCM2 to another column fuse portion, or may divide at least one of addresses of the plurality of redundancy column memory cell arrays RCM1_1 to RCM2_3, may assign a first address of the divided addresses to any one of the plurality of column fuse portions FC1_1 to FC2_3, and may assign a second address of the divided addresses to at least one of the plurality of the other column fuse portions. A detailed description will be given later for this.

Also, the redundancy select controller 100 may receive information AI1 and AI2 about an address from each of the first and second redundancy column memory blocks RCM 1 and RCM2.

For example, the information AI1 about the address of the first redundancy column memory block RCM1 may include not only information about an address of each of the plurality of redundancy column memory cell arrays RCM1_1 to RCM1_3 included in the first redundancy column memory block RCM1 but also information associated with the division of an address of each of the plurality of redundancy column memory cell arrays RCM1_1 to RCM1_3.

Also, the information AI2 about the address of the second redundancy column memory block RCM2 may include not only information about an address of each of the plurality of redundancy column memory cell arrays RCM2_1 to RCM2_3 included in the second redundancy column memory block RCM2 but also information associated with the division of an address of each of the plurality of redundancy column memory cell arrays RCM2_1 to RCM2_3.

In example embodiments, the redundancy select controller 100 may control a corresponding relation between the first redundancy column memory block RCM1 and the first column fuse block FC1 based on the first address information AI1, and may control a corresponding relation between the second redundancy column memory block RCM2 and the second column fuse block FC2 based on the second address information AI2.

In addition, the redundancy select controller 100 may include a plurality of fuses. The plurality of fuses may be the number of fuses, each of the fuses corresponding to corresponding one of the first and second redundancy column memory blocks RCM1 and RCM2. For example, the plurality of fuses may correspond to the plurality of redundancy column memory cell arrays RCM1_1 to RCM1_3 and RCM2_1 to RCM2_3 included in each of the first and second redundancy column memory blocks RCM1 and RCM2, but are limited to thereto.

Also, the redundancy select controller 100 may divide and classify an address of each of the plurality of redundancy column memory cell arrays RCM1_1 to RCM1_3 and RCM2_1 to RCM2_3 included in each of the first and second redundancy column memory blocks RCM1 and RCM2 into at least two or more addresses. Also, the redundancy select controller 100 may control the corresponding relation between the first redundancy column memory block RCM1 and the first column fuse block FC1 through the first multiplexer 110 and may control the corresponding relation between the second redundancy column memory block RCM 2 and the second column fuse block FC2 through the second multiplexer 120. In certain embodiments, the redundancy select controller 100 may control a corresponding relation between the first redundancy column memory block RCM1 and the second column fuse block FC2. Also, the redundancy select controller 100 may control a corresponding relation between the second redundancy column memory block RCM2 and the first row fuse block FC1.

The first and second multiplexers 110 and 120 may be disposed between the first and second column fuse blocks FC1 and FC2 and the redundancy select controller 100, respectively.

In more detail, the first multiplexer 110 may be disposed between the first column fuse block FC1 and the redundancy select controller 100, and may receive the first address information AI1 from the first redundancy column memory block RCM1. Also, the redundancy select controller 100 may control the corresponding relation between the first column fuse block FC1 and the first redundancy column memory block RCM1 through the first multiplexer 110.

Also, the second multiplexer 110 may be disposed between the second column fuse block FC2 and the redundancy select controller 100, and may receive the second address information AI2 from the second redundancy column memory block RCM2. Also, the redundancy select controller 100 may control the corresponding relation between the second column fuse block FC2 and the second redundancy column memory block RCM2 through the second multiplexer 120.

In addition, in FIGS. 2 to 5, the line showing that the first and second address information AI1 and AI2 are provided to the redundancy select controller 100 and the first and second multiplexers 110 and 120 will be omitted.

Figure 2:
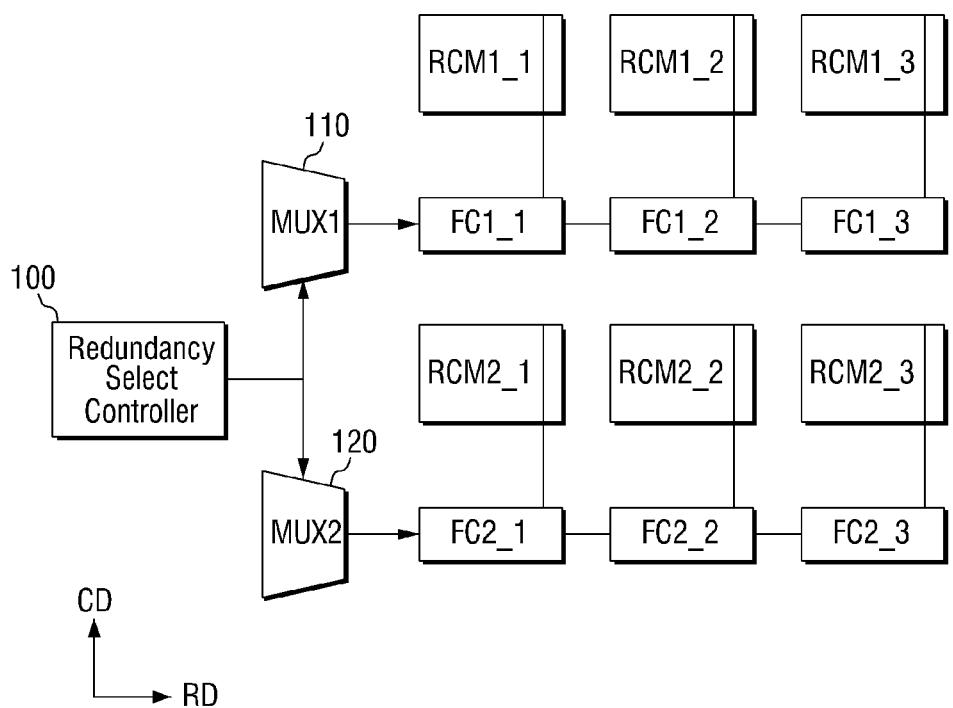
FIGS. 2 to 5 are drawings illustrating corresponding relations between fuse portions and redundancy memory cell arrays of FIG. 1 according to example embodiments.

Referring to FIG. 2, each of a plurality of redundancy column memory cell arrays RCM_1 to RCM1_3 in a first redundancy column memory block RCM1 may correspond to corresponding one of a plurality of column fuse portions FC1_1 to FC1_3 in a first column fuse block FC1. Each of a plurality of redundancy column memory cell arrays RCM2_1 to RCM2_3 in a second redundancy column memory block RCM2 may correspond to corresponding one of a plurality of column fuse portions FC2_1 to FC2_3 in a second column fuse block FC2.

In certain embodiments, each of the plurality of the redundancy column memory cell arrays RCM1_1 to RCM1_3 and RCM2_1 to RCM2_3 may include a plurality of spare memory cells. The plurality of spare memory cells of each of the redundancy column memory cell arrays RCM1_1 to RCM1_3 and RCM2_1 to RCM2_3 may be connected to each of the plurality of column fuse portions by a switch (e.g., a transistor). The switch may be controlled by a spare column selection line (SCSL) signal (not shown) provided in a spare column selection line (SCSL) (not shown) corresponding to a failed column address. For example, each of the fuse portions FC1_1 to FC1_3 and FC2_1 to FC2_3 may generate a RCSL signal (not shown).

In more detail, for example, the redundancy column memory cell array RCM1_1 may correspond to only the one column fuse portion FC1_1. Accordingly, when defects occur in all memory cells in the normal cell array corresponding to a failed column address (not shown) to be repaired, it may be effective to replace the entire redundancy column memory cell array RCM1_1 with the defective cells to be repaired. However, when defects occur in only some of memory cells in the normal cell array corresponding to a failed column address to be repaired, it may be a waste to replace the entire redundancy column memory cell array RCM1_1 with the defective cells to be repaired.

Figure 3:
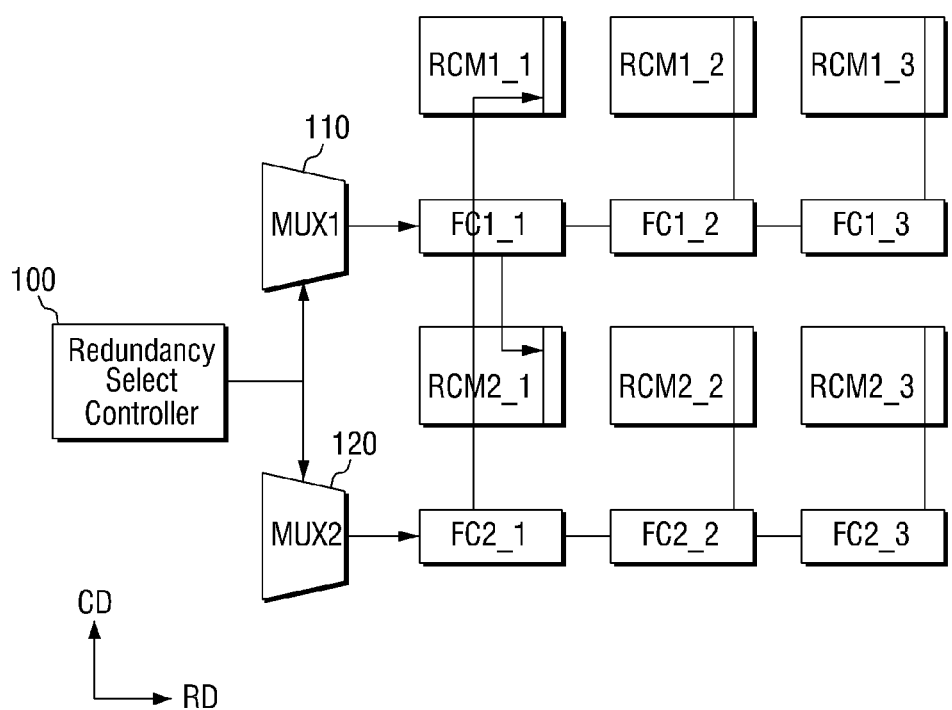

Referring to FIG. 3, a redundancy column memory cell array RCM1_1 may correspond to not a column fuse portion FC1_1 but a column fuse portion FC2_1. A redundancy column memory cell array RCM2_1 may correspond to not a column fuse portion FC2_1 but a column fuse portion FC1_1.

In more detail, a redundancy select controller 100 may assign the column fuse portion FC1_1 which, as shown in FIG. 2, was assigned to the redundancy column memory cell array RCM1_1 to the redundancy column memory cell array RCM2_1. Also, the redundancy select controller 100 may assign the column fuse portion FC2_1 which, as shown in FIG. 2, was assigned to the redundancy column memory cell RCM2_1 to the redundancy column memory cell array RCM1_1.

For example, as shown in FIG. 1, the redundancy select controller 100 may receive the first and second address information AI1 and AI2 from the first and second redundancy column memory blocks RCM1 and RCM2, respectively, and may change corresponding relations between redundancy column memory arrays and column fuse portions based on the first and second address information AI1 and AI2. For example, determining that it is desirable that the column fuse portion FC1_1 is assigned to not the redundancy column memory cell array RCM1_1 but the redundancy column memory cell array RCM2_1 through the first and second address information AI1 and AI2, as shown in FIG. 3, the redundancy select controller 100 may assign the column fuse portion FC1_1 to the redundancy column memory cell array RCM2_1.

In certain embodiments, the redundancy select controller 100 may select one column fuse portion corresponding to any of the redundancy column memory cell arrays based on the address information of the first and second redundancy column memory blocks RCM1 and RCM2.

Figure 4:
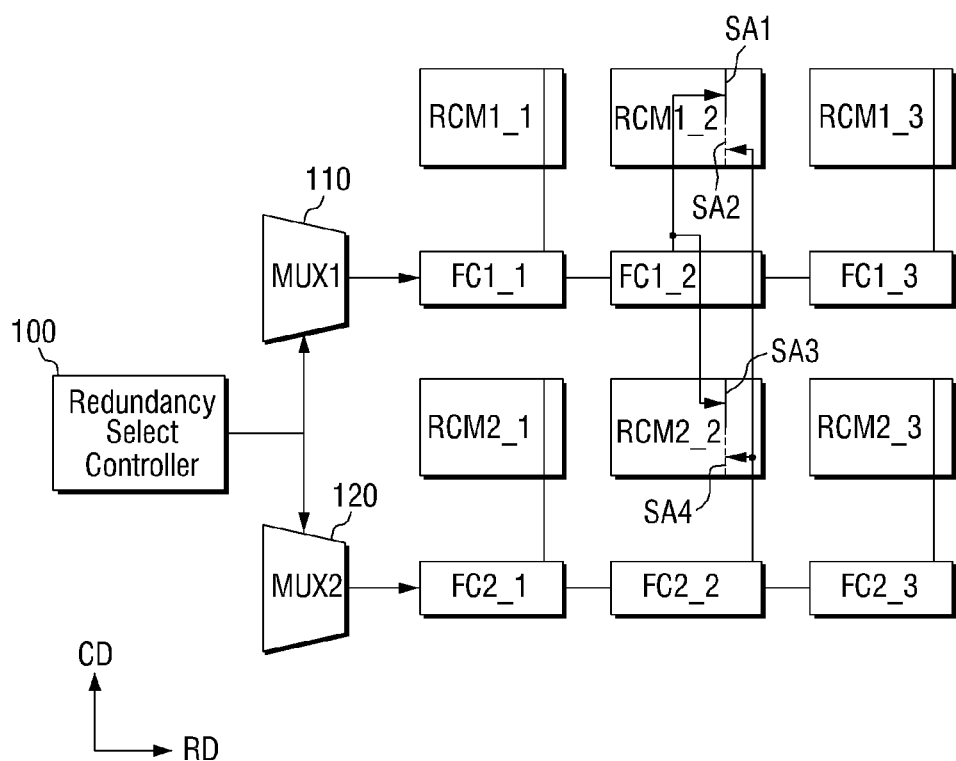

Referring to FIG. 4, a column fuse portion FC1_2 may be assigned to a first sub-address SA1 of a redundancy column memory cell array RCM1_2 and a third sub-address SA3 of a redundancy column memory cell array RCM2_2. Also, a column fuse portion FC2_2 may be assigned to a second sub-address SA2 of the redundancy column memory cell array RCM1_2 and a fourth sub-address SA4 of the redundancy column memory cell array RCM2_2.

In certain embodiments, each of the first sub-address SA1 and the third sub-address SA3 may correspond to one or more defective memory cells in a different block or different bank of a semiconductor device (not shown). For example, the first sub-address SA1 and the third sub-address SA3 may be identical. Each of the second sub-address SA2 and the fourth sub-address SA4 may correspond to one or more defective memory cells in a different block or different bank of a semiconductor device (not shown). For example, the second sub-address SA2 and the fourth sub-address SA4 may be identical. Each of the first sub-address SA1 and the second sub-address SA2 may be different from each other and each of the third sub-address SA3 and the fourth sub-address SA4 may be different from each other.

In certain embodiments, the column fuse portion FC1_2 may store a failed column address corresponding to the first sub-address SA1 and the third sub-address SA3, and may generate a first spare column selection line (SCSL1) signal (not shown). The column fuse portion FC2_2 may store a failed column address corresponding to the second sub-address SA2 and the fourth sub-address SA4 and may generate a second spare column selection line (SCSL2) signal (not shown).

In certain embodiments, sizes of categories of the first to fourth sub-addresses SA1 to SA4 may be different from one other, but they are not limited thereto. For example, all of the sizes of the categories of the first to fourth sub-addresses SA1 to SA4 may be identical to one another. Or, some of the sizes of the categories of the first to fourth sub-addresses SA1 to SA4 may be identical to each other and the others may be different from each other.

In certain embodiments, a redundancy select controller 100 may assign the column fuse portion FC1_2 which, as shown in FIG. 2, was assigned only to the redundancy column memory cell array RCM1_2 to the first sub-address SA1 of the redundancy column memory cell array RCM1_2 and the third sub-address SA3 of the redundancy column memory cell array RCM2_2. Also, the redundancy select controller 100 may assign the column fuse portion FC2_2 which, as shown in FIG. 2, was assigned only to the redundancy column memory cell array RCM2_2 to the second sub-address SA2 of the redundancy column memory cell array RCM1_2 and the fourth sub-address SA4 of the redundancy column memory cell array RCM2_2.

For example, as shown in FIG. 1, the redundancy select controller 100 may receive the first and second address information AI1 and AI2 from the first and second redundancy column memory blocks RCM1 and RCM2, respectively, and may change corresponding relations between redundancy column memory cell arrays and column fuse portions based on the first and second address information AI1 and AI2. In certain embodiments, the first and second address information AI1 and AI2 may include not only information about addresses of the first and second redundancy column memory blocks RCM1 and RCM2 but also information about the division of each of addresses of the first and second redundancy column memory blocks RCM1 and RCM2.

For example, when it is unnecessary to repair one or more defective cells with all spare memory cells of one redundancy column memory cell array because the one or more defective cells to be repaired are located in several areas corresponding to different column addresses, the redundancy select controller 100 may select the redundancy column memory cell array RCM1_2 as a redundancy memory cell to repair the one or more defective cells. The redundancy select controller 100 may assign the column fuse portion FC1_2 to not all spare memory cells of the redundancy column memory cell array RCM1_2 but only some of spare memory cells corresponding to one address (e.g., the first sub-address SA1) thereof and may assign another column fuse portion (e.g., the column fuse portion FC2_2) to the other spare memory cells corresponding to an address (e.g., the second sub-address SA2) thereof.

In certain embodiments, the redundancy select controller 100 may divide a plurality of spare memory cells of at least one of the redundancy column memory cell arrays RCM1_1 to RCM1_3 and RCM2_1 to RCM2_3 (for example, it may divide and classify an address of the corresponding redundancy column memory cell array), and may allow another fuse portion to share the divided address of the corresponding redundancy column memory cell array.

Figure 5:
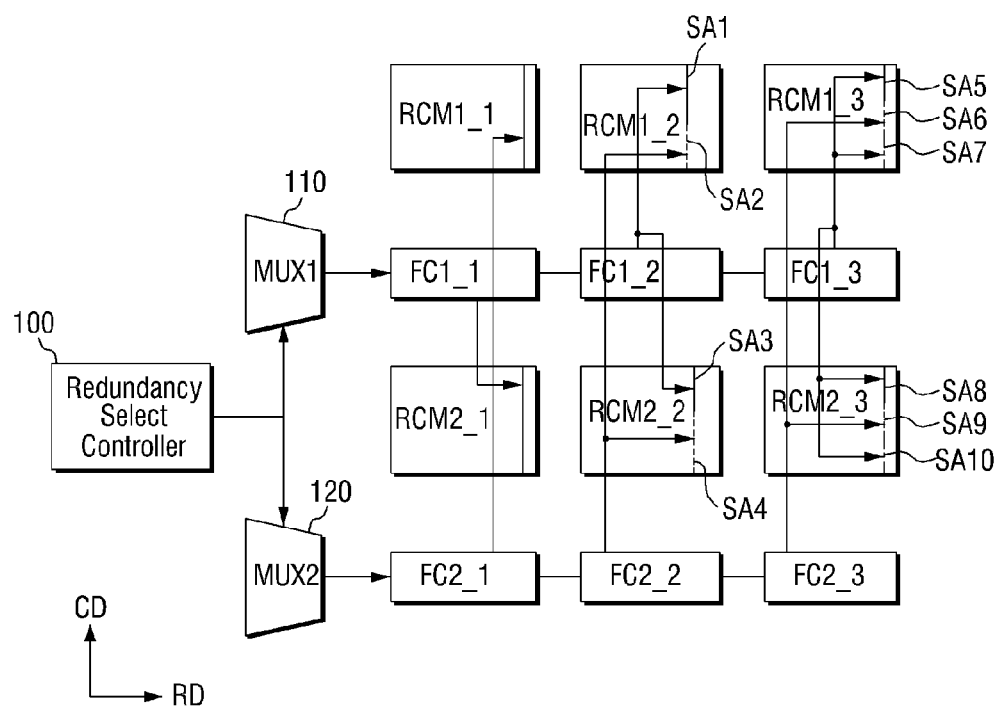

Referring to FIG. 5, it may be known that the exemplary embodiments, described above, in FIG. 3 and FIG. 4 are applied to an exemplary embodiment of FIG. 5. Also, another exemplary embodiment which is different from the exemplary embodiment of FIG. 4 is shown through redundancy column memory cell arrays RCM1_3 and RCM2_3 and column fuse portions FC1_3 and FC2_3.

In certain embodiments, the column fuse portion FC1_3 may be assigned to fifth and seventh sub-addresses SA5 and SA7 of the redundancy column memory cell array RCM1_3 and eighth and tenth sub-addresses SA8 and SA10 of the redundancy column memory cell array RCM2_3. For example, each of the fifth, seventh, eighth and tenth sub-addresses SA5, SA7, SA8 and SA10 may correspond to a first failed column address. The first failed column address may be stored in the column fuse portion FC1_3, and the column fuse portion FC1_3 may generate a first spare column selection line (SCSL1) signal (not shown). Also, the column fuse portion FC2_3 may be assigned to a sixth sub-address SA6 of the redundancy column memory cell array RCM1_3 and a ninth sub-address SA9 of the redundancy column memory cell array RCM2_3. For example, each of the sixth and ninth sub-addresses SA6 and SA9 may correspond to a second failed column address. The second failed column address may be stored in the column fuse portion FC2_3, and the column fuse portion FC2_3 may generate a second spare column selection line (SCSL2) signal (not shown).

In certain embodiments, the redundancy select controller 100 may assign the column fuse portion FC1_3 to the fifth, seventh, eighth, and tenth sub-addresses SA5, SA7, SA8, and SA10, and may assign the column fuse portion FC2_3 to the sixth and ninth sub-addresses SA6 and SA9.

In certain embodiments, sizes of categories of the fifth to tenth sub-addresses SA5 to SA10 may be different from one another, but are limited thereto. For example, all of the sizes of the categories of the fifth to tenth sub-addresses SA5 to SA10 may be identical to one another. Some of the sizes of the categories of the fifth to tenth sub-addresses SA5 to SA10 may be identical to one another, and the others may be different from one another.

FIGS. 3 to 5 described above illustrate only a change in the assignment state of the two fuse portions for the redundancy column memory cells in a column direction CD, but is not limited thereto. For example, a semiconductor device 1 may include three fuse portions or more in the column direction CD. Including the three fuse portions or more, the semiconductor device 1 may also change assignment states of the three fuse portions or more for redundancy column memory cells in more various methods.

For example, though not illustrated in the drawings, when the semiconductor device 1 includes first to third redundancy column memory cell arrays and first to third column fuse portions corresponding to them, the redundancy select controller 100 may change a fuse portion corresponding to the first redundancy column memory cell array to the second column fuse portion, may change a fuse portion corresponding to the second redundancy column memory cell to the third column fuse portion, and may change a fuse portion corresponding to the third redundancy column memory cell to the first column fuse portion.

Also, the redundancy select controller 100 may divide and classify an address of the first redundancy column memory cell array into first and second sub-addresses, may divide and classify an address of the second redundancy column memory cell array into third and fourth sub-addresses, and may divide and classify an address of the third redundancy column memory cell array into fifth and sixth sub-addresses. Therefore, the redundancy select controller 100 may change the first column fuse portion to correspond to the first and third sub-addresses, may change the second column fuse portion to correspond to the fourth and sixth sub-addresses, and may change the third column fuse portion to correspond to the fifth and second sub-addresses.

The semiconductor device 1 according to certain embodiments of the inventive concept may minimize the waste of fuse portions and may solve a plurality of defects which may occur in defective cells to be repaired through redundancy memory cells by changing a column fuse portion corresponding to a redundancy column memory cell array to another adjacent column fuse portion through the redundancy select controller 100, or dividing an address of a redundancy column memory cell array into a plurality of addresses and sharing the divided addresses with a column fuse portion through the redundancy select controller 100. Also, the semiconductor device 1 may also improve yields of the product by minimizing the waste of fuse portions.

Hereinafter, a description will be given for a semiconductor device according to example embodiments of the inventive concept with reference to FIG. 6. A semiconductor device 2 of FIG. 6 includes the semiconductor device 1 of FIG. 1 (that is, an exemplary embodiment of the semiconductor device 2 is an embodiment of expanding the semiconductor device 1), so no detailed description of the same configurations will be provided.

Figure 6:
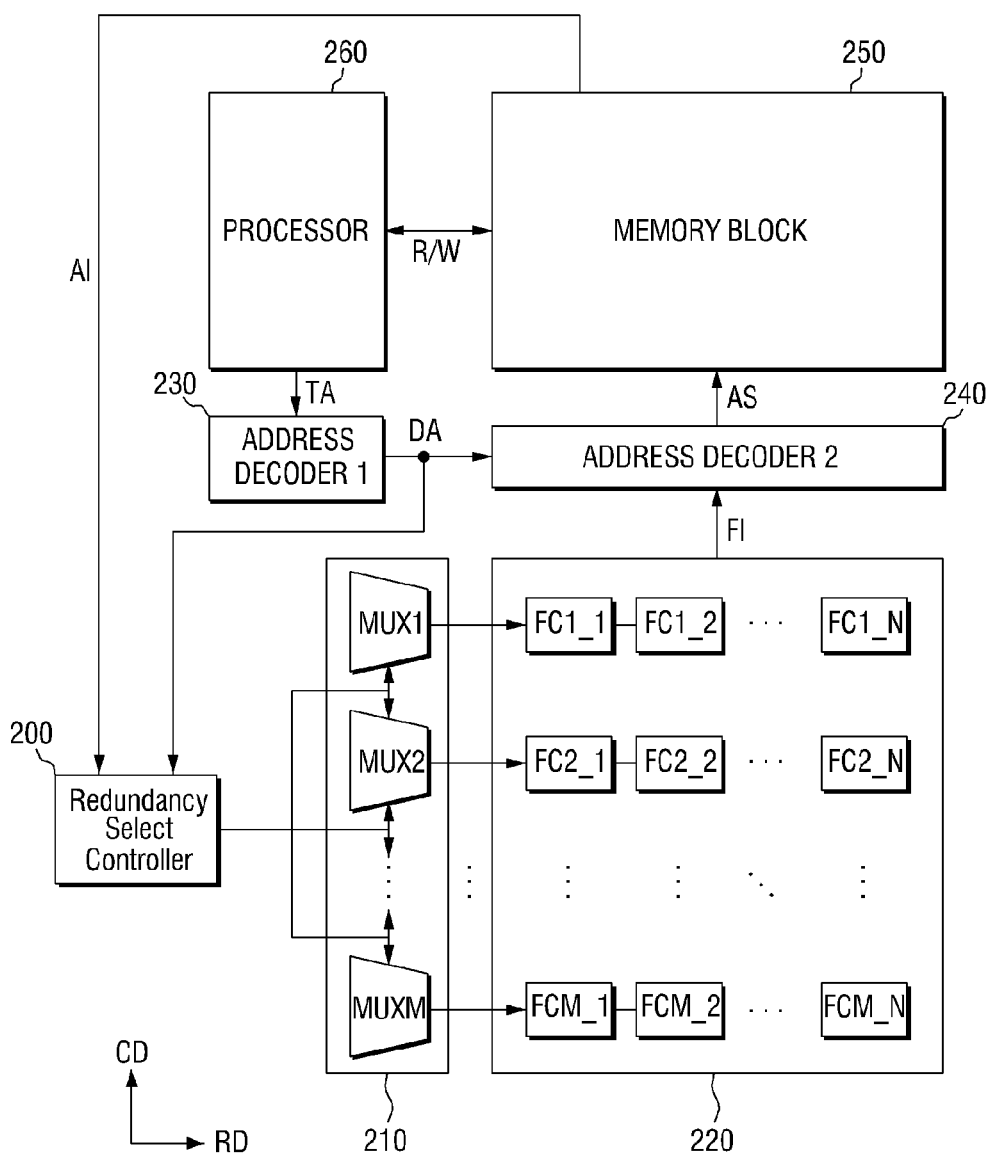
FIG. 6 is a block diagram illustrating a configuration of a semiconductor device according to example embodiments of the inventive concept.

FIG. 6 is a block diagram illustrating a configuration of a semiconductor device according to example embodiments of the inventive concept.

Referring to FIG. 6, the semiconductor device 2 may include a redundancy select controller 200, a multiplexer 210, a column fuse block 220, a first address decoder 230, a second address decoder 240, a memory block 250, and a processor 260.

Herein, a description for the redundancy select controller 200, the multiplexer 210, and the column fuse block 220 including a plurality of fuse portions was provided in the semiconductor device 1 described above, so no detailed description of the same configurations will be provided.

The first address decoder 230 may receive an address TA of a normal cell array (not shown) included in the memory block 250, which is a target of a read or write operation of the processor 260, from the processor 260 and may decode the received address TA. For example, the memory block 250 may include a normal cell array and a redundancy cell array (or, a spare cell array). The normal cell array may include a plurality of memory cells and the redundancy cell array may include one or more redundancy column memory cell arrays each including a plurality of spare memory cells for replacing one or more defective memory cells in the normal cell array for being repaired.

In more detail, the first address decoder 230 may receive the address TA of the normal cell array which is the target of the read or write operation of the processor 260 from the processor 260, may decode the received address TA, and may provide the decoded address DA to the second address decoder 240 and the redundancy select controller 200.

The second address decoder 240 may be connected between the column fuse block 220 and the memory block 250, may receive the decoded address DA and fuse block information FI, and may select the normal cell array or redundancy cell array as a target of a read or write operation of the processor 260.

In certain embodiments, the fuse block information FI may include address information (e.g., column address information of a defective cell) of the defective cell programmed in each of a plurality of column fuse portions included in the column fuse block 220 and information about corresponding relations between the plurality of column fuse portions and the plurality of redundancy column memory cell arrays.

For example, the second address decoder 240 may compare the decoded address DA with an address of a defective cell, which is programmed in the column fuse block 220. As a result of the comparison, when the decoded address DA is identical to the address of the defective cell, which is programmed in the column fuse block 220, the second address decoder 240 may allow a spare column selection line (SCSL) of a redundancy column memory cell array to replace a defective cell among the plurality of redundancy column memory cell arrays to be in an active state. The processor 260 may perform a read or write operation from or in the corresponding redundancy column memory cell. In contrast, as a result of the comparison, when the decoded address DA is different from the address of the defective cell, which is programmed in the column fuse block 220, the second address decoder 240 may allow a column selection line (CSL) of the normal cell array in which the processor 260 wants to perform a read or write operation first to be in an active state. The processor 260 may perform a read or write operation from or in a corresponding address of the normal cell array.

Herein, wanting to allow a spare column selection line (SCSL) of the redundancy column memory cell array or a column selection line (CSL) of the normal cell array to be in an active state, the second address decoder 240 may provide an active signal AS to the memory block 250, that is, the spare column selection line (SCSL) of the redundancy column memory cell array or the column selection line (CSL) of the normal cell array in the memory block 250.

In addition, the redundancy select controller 200 may receive information AI about an address of a redundancy cell array from the memory block 250, that is, the redundancy column memory cell array in the memory block 250, may receive the decoded address DA from the first address decoder 230, and may control corresponding relations between the plurality of column fuse portions and the plurality of redundancy column memory cell arrays based on the received information and address.

Hereinafter, a description will be given for a semiconductor device according to example embodiments of the inventive concept with reference to FIGS. 7 to 11.

Figure 7:
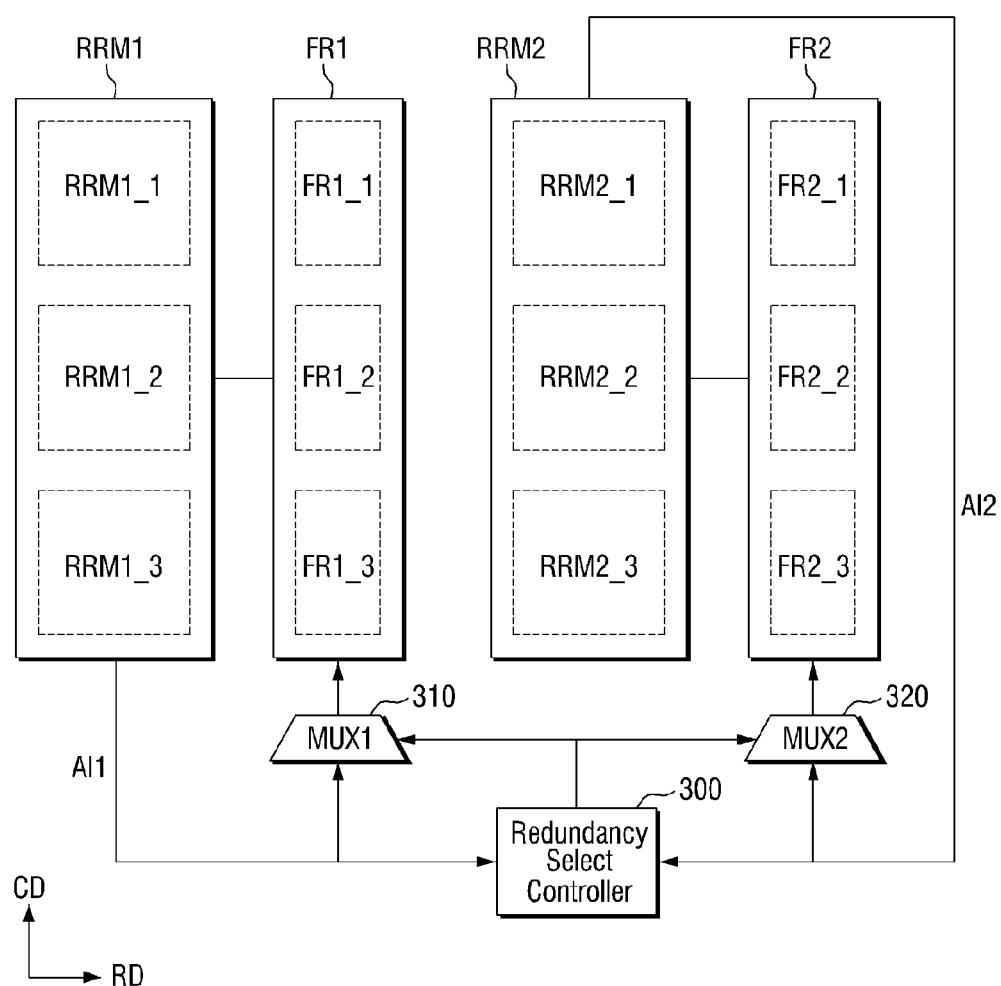
FIG. 7 is a block diagram illustrating a configuration of a semiconductor device according to example embodiments of the inventive concept.

FIG. 7 is a block diagram illustrating a configuration of a semiconductor device according to example embodiments of the inventive concept. FIGS. 8 to 11 are drawings illustrating corresponding relations between fuse portions and redundancy memory cells of FIG. 7 according to example embodiments.

Referring to FIG. 7, the semiconductor device denoted by 3 may include first and second redundancy memory blocks RRM1 and RRM2, first and second fuse blocks FR1 and FR2, a redundancy select controller 300, and first and second multiplexers 310 and 320.

Herein, the embodiment of the semiconductor device 3 corresponds to an embodiment driven along row selection lines (e.g., word lines). Hereinafter, the first and second redundancy memory blocks RRM1 and RRM2 may be referred to as first and second redundancy row memory blocks and the first and second fuse blocks FR1 and FR2 may be referred to as first and second row fuse blocks.

The first redundancy row memory block RRM1 may include a plurality of redundancy row memory cell arrays RRM1_1 to RRM1_3. Also, the second redundancy row memory block RRM2 may include a plurality of redundancy row memory cell arrays RRM2_1 to RRM2_3.

In more detail, the first redundancy row memory block RRM1 may include a spare memory cell for preparing a normal cell array (not shown) for being repaired, that is, for repairing a defective cell in the normal cell array, and may also include a plurality of spare memory cells.

In certain embodiments, a plurality of spare memory cells in each of the redundancy row memory cell arrays RRM1_1 to RRM1_3 and RRM2_1 to RRM2_3 may be arranged in one row line.

FIG. 7 illustrates that the first redundancy row memory block RRM1 includes three redundancy row memory cell arrays RRM1_1 to RRM1_3, but is not limited thereto. For example, the first redundancy row memory block RRM1 may include redundancy row memory cell arrays RRM1_1 to RRM1_3 which are greater or less than the three redundancy row memory cell arrays.

Also, the second redundancy row memory block RRM2 may also include a spare memory cell for preparing the normal cell array for being repaired, that is, for repairing a defective cell in the normal cell array, and may be a plurality of spare memory cells.

FIG. 7 illustrates that the second redundancy row memory block RRM2 includes three redundancy row memory cell arrays RRM2_1 to RRM2_3, but is not limited thereto. For example, the second redundancy row memory block RRM2 may also include redundancy row memory cell arrays RRM2_1 to RRM2_3 which are greater or less than the three redundancy row memory cell arrays.

The first row fuse block FR1 may include a plurality of row fuse portions FR1_1 to FR1_3. Also, the second row fuse block FR2 may include a plurality of row fuse portions FR2_1 to FR2_3.

In more detail, the first row fuse block FR1 may correspond to the first redundancy row memory block RRM1. An address of a defective cell in the normal cell array, that is, a row address of the defective cell may be programmed in each of the row fuse portions FR1_1 to FR1_3.

FIG. 7 illustrates that the first row fuse block FR1 includes three row fuse portions FR1_1 to FR1_3, but is not limited thereto. For example, the first row fuse block FR1 may include row fuse portions which are greater or less than the three row fuse portions FR1_1 to FR1_3.

Also, the second row fuse block FR2 may correspond to the second redundancy row memory block RRM2. An address of a defective cell in the normal cell array, that is, a row address of the defective cell may be programmed in each of the row fuse portions FR2_1 to FR2_3.

FIG. 7 illustrates that the second row fuse block FR2 includes three row fuse portions FR2_1 to FR2_3, but is not limited thereto. For example, the second row fuse block FR2 may include row fuse portions which are greater or less than the three row fuse portions FR2_1 to FR2_3.

The redundancy select controller 300 may change one row fuse portion corresponding to each of the first and second redundancy row memory blocks RRM1 and RRM2 to another row fuse portion. In certain embodiments, the redundancy select controller 300 may divide at least one address of the plurality of redundancy row memory cell arrays RRM1_1 to RRM1_3, may assign a first address of the divided addresses to any one of the plurality of row fuse portions FR1_1 to FR1_3, and may assign a second address of the divided addresses to at least one of the plurality of the other row fuse portions. A detailed description will be given later for this.

Also, the redundancy select controller 300 may receive information AI1 and AI2 about addresses from each of the first and second redundancy row memory blocks RRM1 and RRM2, respectively.

For example, the information AI1 about the address of the first redundancy row memory block RRM1 may include not only information about an address of each of the plurality of redundancy row memory cell arrays RRM1_1 to RRM1_3 included in the first redundancy row memory block RRM1 but also information associated with the division of an address of each of the plurality of redundancy row memory cell arrays RRM1_1 to RRM1_3.

Also, the information AI2 about the address of the second redundancy row memory block RRM2 may include not only information about an address of each of the plurality of redundancy row memory cell arrays RRM2_1 to RRM2_3 included in the second redundancy row memory block RRM2 but also information associated with the division of an address of each of the plurality of redundancy row memory cell arrays RRM2_1 to RRM2_3.

In certain embodiments, the redundancy select controller 300 may control a corresponding relation between the first redundancy row memory block RRM1 and the first row fuse block FR1 based on the first address information AI1. Also, the redundancy select controller 300 may control a corresponding relation between the second redundancy row memory block RRM2 and the second row fuse block FR2 based on the second address information AI2.

In addition, the redundancy select controller 300 may include a plurality of fuses. Herein, the plurality of fuses may be the number of fuses, each of the fuses corresponding to corresponding one of the first and second redundancy row memory blocks RRM1 and RRM2. For example, the plurality of fuses may correspond to the plurality of redundancy row memory cell arrays RRM1_1 to RRM1_3 and RRM2_1 to RRM2_3 included in the first and second redundancy row memory blocks RRM1 and RRM2, respectively, but are not limited thereto.

Also, the redundancy select controller 300 may divide and classify an address of each of the plurality of redundancy row memory cell arrays RRM1_1 to RRM1_3 and RRM2_1 to RRM2_3 included in each of the first and second redundancy row memory blocks RRM1 and RRM2 into at least two or more addresses. Also, the redundancy select controller 300 may control a corresponding relation between the first redundancy row memory block RRM1 and the first row fuse block FR1. Also, the redundancy select controller 300 may control a corresponding relation between the second redundancy row memory block RRM2 and the second row fuse block FR2.

In certain embodiments, the redundancy select controller 300 may control a corresponding relation between the first redundancy row memory block RRM1 and the second row fuse block FR2. Also, the redundancy select controller 300 may control a corresponding relation between the second redundancy row memory block RRM2 and the first row fuse block FR1.

The first and second multiplexers 310 and 320 may be disposed between the first and second row fuse blocks FR1 and FR2 and the redundancy select controller 300.

In more detail, the first multiplexer 310 may be disposed between the first row fuse block FR1 and the redundancy select controller 300, and may receive the first address information AI1 from the first redundancy row memory block RRM1. Also, the redundancy select controller 300 may control the corresponding relation between the first row fuse block FR1 and the first redundancy row memory block RRM1 through the first multiplexer 310.

Also, the second multiplexer 320 may be disposed between the second row fuse block FR2 and the redundancy select controller 300, and may receive the second address information AI2 from the second redundancy row memory block RRM2. Also, the redundancy select controller 300 may control the corresponding relation between the second row fuse block FR2 and the second redundancy row memory block RRM2 through the second multiplexer 320.

In addition, in FIGS. 8 to 11 below, the line showing that the first and second address information AI1 and AI2 are provided to the redundancy select controller 300 and the first and second multiplexers 310 and 320 will be omitted.

Figure 8:
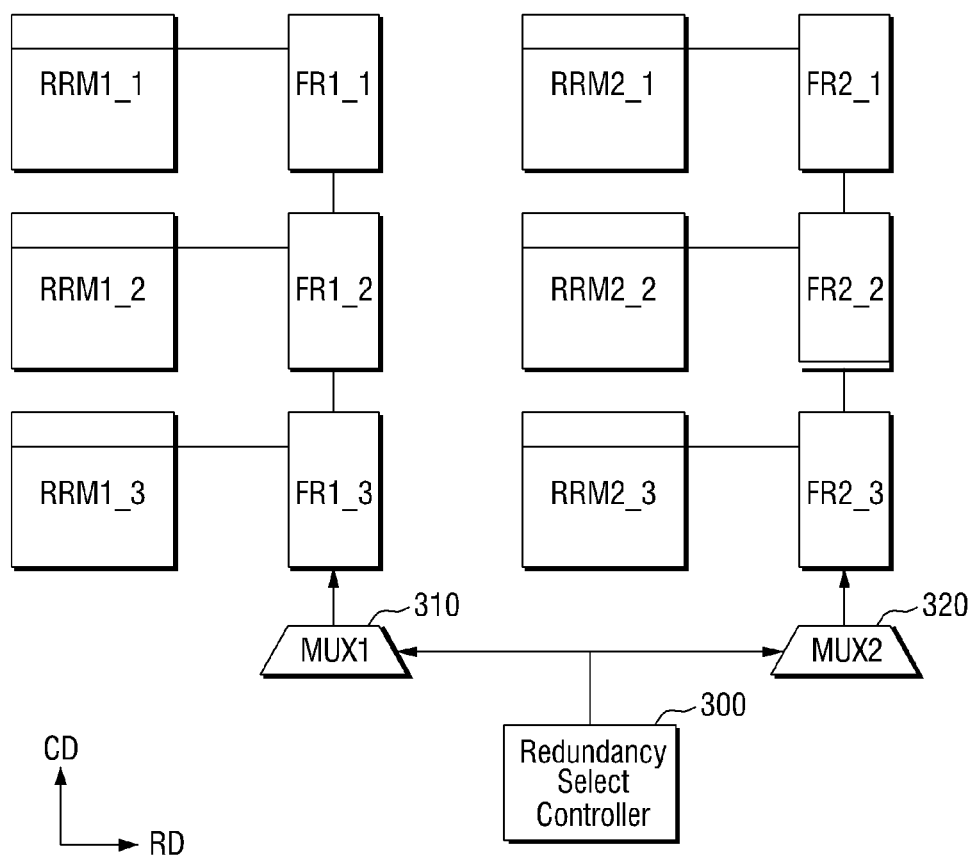
FIGS. 8 to 11 are drawings illustrating corresponding relations between fuse portions and redundancy memory cells of FIG. 7 according to example embodiments.

Referring to FIG. 8, each of a plurality of redundancy row memory cell arrays RRM_1 to RRM1_3 in a first redundancy row memory block RRM1 may correspond to corresponding one of a plurality of fuse portions in a first row fuse block FR1. Each of a plurality of redundancy row memory cell arrays RRM2_1 to RRM2_3 in a second redundancy column memory block RRM2 may correspond to corresponding one of a plurality of fuse portions in a second row fuse block FR2.

In certain embodiments, each of the plurality of the redundancy row memory cell arrays RRM1_1 to RRM1_3 and RRM2_1 to RRM2_3 may include a plurality of spare memory cells connected to a spare word line (SWL). A spare word line signal on the spare word line may correspond to a failed row address. For example, each of the fuse portions FR1_1 to FR1_3 and FR2_1 to FR2_3 may generate a SWL signal.

In more detail, for example, the redundancy row memory cell array RRM1_1 may correspond to only the one row fuse portion FR1_1. Accordingly, when defects occur in all memory cells in the normal cell array corresponding to a failed row address (not shown) to be repaired, it may be effective to replace the entire redundancy row memory cell array RRM1_1 with the defective cells to be repaired. However, when defects occur in only some of memory cells in the normal cell array corresponding to a failed row address to be repaired, it may be a waste to replace the entire redundancy row memory cell array RRM1_1 with the defective cells to be repaired.

Figure 9:
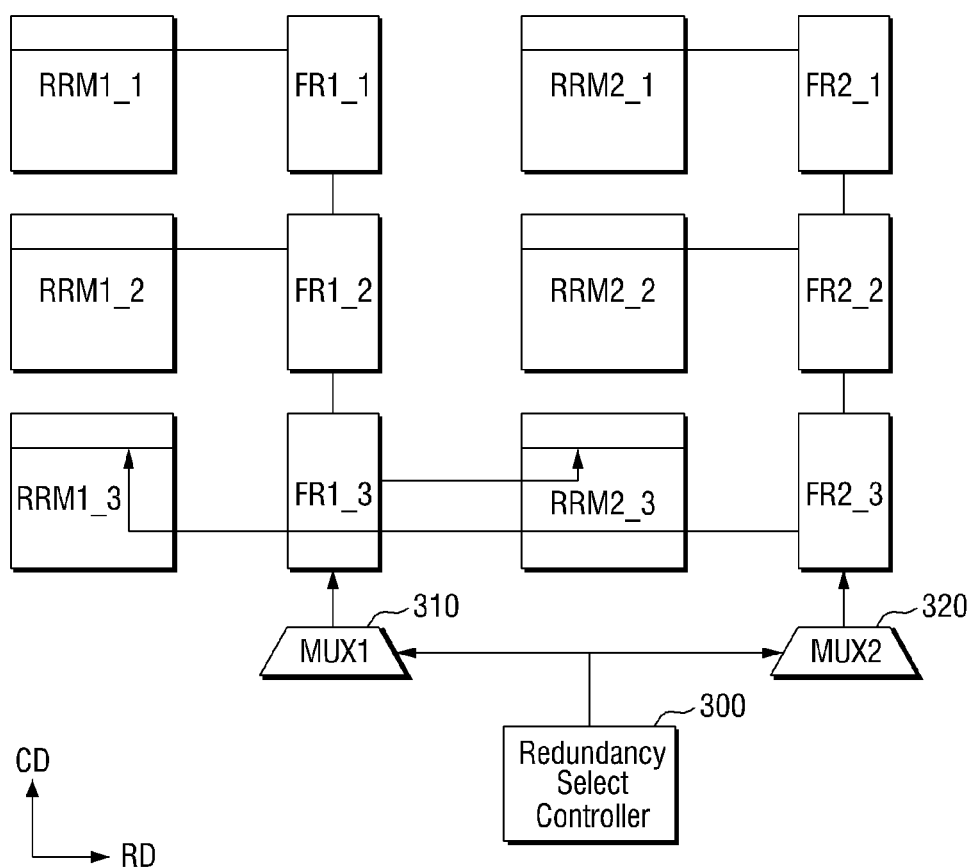

Referring to FIG. 9, a redundancy row memory cell array RRM1_3 may correspond to not a row fuse portion FR1_3 but a row fuse portion FR2_3. A redundancy row memory block RRM2_3 may correspond to not the row fuse portion FR2_3 but the row fuse portion FR1_3.

In more detail, a redundancy select controller 300 may assign the row fuse portion FR1_3 which, as shown in FIG. 8, was assigned to the redundancy row memory cell array RRM1_3 to the redundancy row memory cell array RRM2_3. Also, the redundancy select controller 300 may assign the row fuse portion FR2_3 which, as shown in FIG. 8, was assigned to the redundancy row memory cell array RRM2_3 to the redundancy row memory cell array RRM1_3.

For example, as shown in FIG. 7, the redundancy select controller 300 may receive the first and second address information AI1 and AI2 from the first and second redundancy row memory blocks RRM1 and RRM2, respectively, and may change corresponding relations between redundancy row memory arrays and row fuse portions based on the first and second address information AI1 and AI2. For example, determining that it is desirable that the row fuse portion FR1_3 is assigned to not the redundancy row memory cell array RRM1_3 but the redundancy row memory cell array RRM2_3 through the first and second address information AI1 and AI2, as shown in FIG. 9, the redundancy select controller 300 may assign the row fuse portion FR1_3 to the redundancy row memory cell array RRM2_3.

In certain embodiments, the redundancy select controller 300 may select one row fuse portion corresponding to any of the redundancy row memory cell arrays based on the address information of each of the first and second redundancy row memory blocks RRM1 and RRM2.

Figure 10:
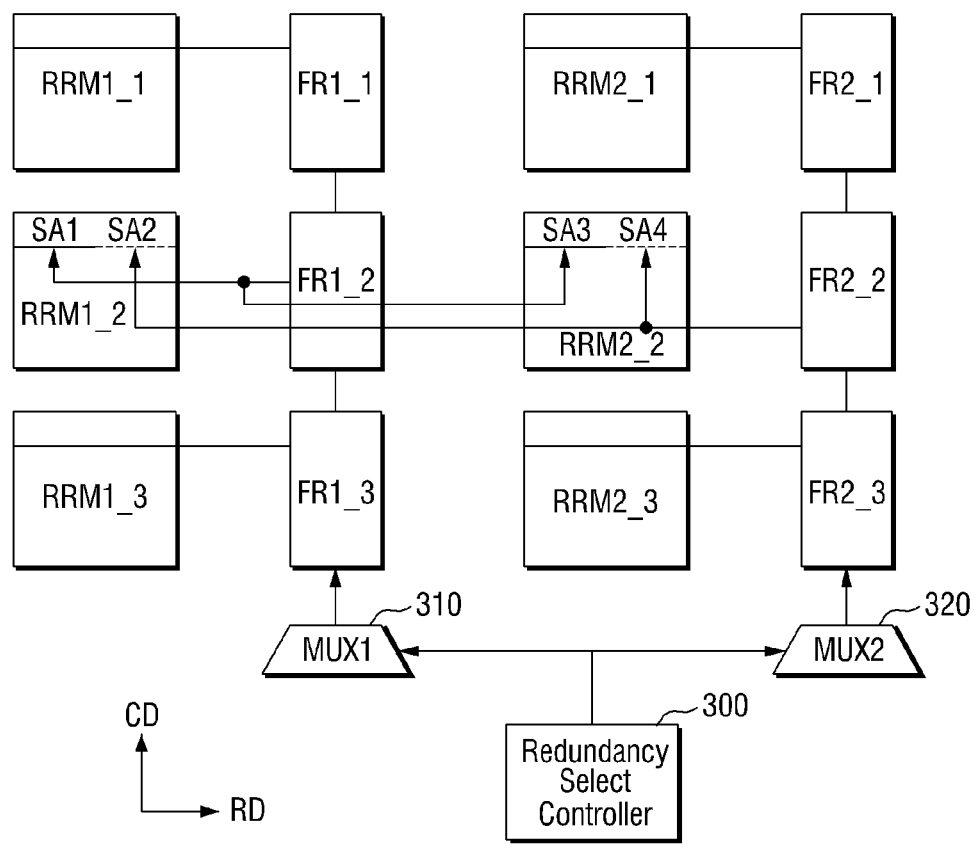

Referring to FIG. 10, a row fuse portion FR1_2 may be assigned to a first sub-address SA1 of a redundancy row memory cell array RRM1_2 and a third sub-address SA3 of a redundancy row memory cell array RRM2_2. Also, a row fuse portion FR2_2 may be assigned to a second sub-address SA2 of the redundancy row memory cell array RRM1_2 and a fourth sub-address SA4 of the redundancy row memory cell RRM2_2. For example, sizes of categories of the first to fourth sub-addresses SA1 to SA4 may be different from one other, but are limited thereto. For example, all of the sizes of the categories of the first to fourth sub-addresses SA1 to SA4 may be identical to one another. For example, some of the sizes of the categories of the first to fourth sub-addresses SA1 to SA4 may be identical to each other and the other of them may be different from each other.

In certain embodiments, each of the first sub-address SA1 and the third sub-address SA3 may correspond to one or more defective memory cell in a different block or different bank of a semiconductor device (not shown). For example, the first sub-address SA1 and the third sub-address SA3 may be identical. Each of the second sub-address SA2 and the fourth sub-address SA4 may correspond to one or more defective memory cell in a different block or different bank of a semiconductor device (not shown). For example, the second sub-address SA2 and the fourth sub-address SA4 may be identical. Each of the first sub-address SA1 and the second sub-address SA2 may be different from each other and each of the third sub-address SA3 and the fourth sub-address SA4 may be different from each other.

In certain embodiments, the row fuse portion FR1_2 may store a failed row address corresponding to the first sub-address SA1 and the third sub-address SA3, and may generate a first spare row word line (SWL1) signal. The row fuse portion FR2_2 may store a failed row address corresponding to the second sub-address SA2 and the fourth sub-address SA4, and may generate a second spare row word line (SWL2) signal.

In certain embodiments, a redundancy select controller 300 may assign the row fuse portion FR1_2 which, as shown in FIG. 8, was assigned only to the redundancy row memory cell array RRM1_2 to the first sub-address SA1 of the redundancy row memory cell array RRM1_2 and the third sub-address SA3 of the redundancy row memory cell array RRM2_2. Also, the redundancy select controller 300 may assign the row fuse portion FR2_2 which, as shown in FIG. 8, was assigned only to the redundancy row memory cell array RRM2_2 to the second sub-address SA2 of the redundancy row memory cell array RRM1_2 and the fourth sub-address SA4 of the redundancy row memory cell array RRM2_2.

For example, as shown in FIG. 7, the redundancy select controller 300 may receive the first and second address information AI1 and AI2 from the first and second redundancy row memory blocks RRM1 and RRM2, respectively, and may change corresponding relations between redundancy row memory cell arrays and row fuse portions based on the first and second address information AI1 and AI2. In certain embodiments, the first and second address information AI1 and AI2 may include not only information about addresses of the first and second redundancy row memory blocks RRM1 and RRM2 but also information about the division of an address of each of the first and second redundancy row memory blocks RRM1 and RRM2.

For example, when it is unnecessary to repair one or more defective cells with all spare memory cells of one redundancy row memory cell array because the one or more defective cells to be repaired are located in several areas corresponding to different row addresses, the redundancy select controller 300 may select the redundancy row memory cell array RRM1_2 as a redundancy row memory cell to repair the one or more defective cells. The redundancy select controller 300 may assign the row fuse portion FR1_2 to not all spare memory cells of the redundancy row memory cell array RRM1_2 but only some of spare memory cells corresponding to one address (e.g., the first sub-address SA1) thereof and may assign another row fuse portion (e.g., the row fuse portion FR2_2) to the other spare memory cells corresponding to an address (e.g., the second sub-address SA2) thereof.

In certain embodiments, the redundancy select controller 300 may divide a plurality of spare memory cells of at least one of the redundancy row memory cell arrays RRM1_1 to RRM1_3, and RRM2_1 to RRM2_3 (that is, may divide and classify an address of the corresponding redundancy row memory cell array), and may allow another fuse portion to share the divided address of the corresponding redundancy row memory cell array.

Figure 11:
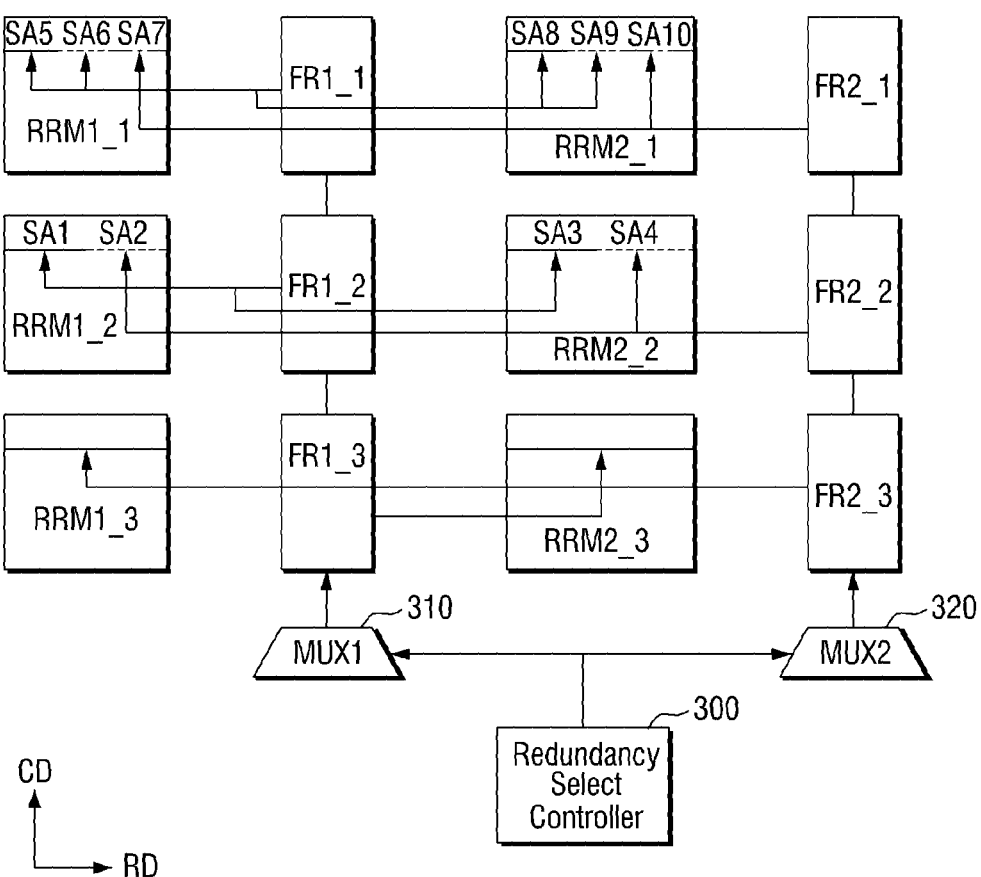

Referring to FIG. 11, it may be known that the exemplary embodiments, described above, in FIGS. 9 and 10 are applied to an exemplary embodiment of FIG. 11. Also, another exemplary embodiment which is different from the exemplary embodiment of FIG. 10 is shown through redundancy row memory cell arrays RRM1_1 and RRM2_1 and row fuse portions FR1_1 and FR2_1.

In certain embodiments, the row fuse portion FR1_1 may be assigned to fifth and sixth sub-addresses SA5 and SA6 of the redundancy row memory cell RRM1_1 and eighth and ninth sub-addresses SA8 and SA9 of the redundancy row memory cell array RRM2_1. For example, each of the fifth, sixth, eighth and ninth sub-addresses SA5, SA6, SA8 and SA9 may correspond to a first failed row address. The first failed row address may be stored in the row fuse portion FR1_1, and the row fuse portion FR1_1 may generate a first spare word line (SWL1) signal (not shown). Also, the row fuse portion FC2_1 may be assigned to a seventh sub-address SA7 of the redundancy row memory cell array RRM1_1 and a tenth sub-address SA10 of the redundancy row memory cell array RRM2_1. For example, each of the seventh and tenth sub-addresses SA7 and SA10 may correspond to a second failed row address. The second failed row address may be stored in the row fuse portion FR2_1, and the row fuse portion FR2_1 may generate a second spare word line (SWL2) signal (not shown).

In certain embodiments, the redundancy select controller 100 may assign the row fuse portion FR1_1 to the and ninth sub-addresses SA5, SA6, SA8 and SA9, and may assign the row fuse portion FR2_1 to the seventh and tenth sub-addresses SA7 and SA10.

In certain embodiments, sizes of categories of the fifth to tenth sub-addresses SA5 to SA10 may be different from one another, but are limited thereto. For example, all of the sizes of the categories of the fifth to tenth sub-addresses SA5 to SA10 may be identical to one another. Some of the sizes of the categories of the fifth to tenth sub-addresses SA5 to SA10 may be identical to one another, and the others may be different from one another.

FIGS. 8 to 10 described above illustrate only a change in an assignment state of the two fuse portions for the redundancy row memory cells in a row direction RD, but is not limited thereto. For example, a semiconductor device 3 may include three fuse portions or more in the row direction CD. Including the three fuse portions or more, the semiconductor device 3 may also change assignment states of the three fuse portions or more for redundancy row memory cells in more various methods.

For example, though not illustrated in the drawings, when the semiconductor device 3 includes first to third redundancy row memory cell arrays and first to third row fuse portions corresponding to them, the redundancy select controller 300 may change a fuse portion corresponding to the first redundancy row memory cell array to the second row fuse portion, may change a fuse portion corresponding to the second redundancy row memory cell to the third row fuse portion, and may change a fuse portion corresponding to the third redundancy row memory cell to the first row fuse portion.

Also, the redundancy select controller 300 may divide and classify an address of the first redundancy row memory cell array into first and second sub-addresses, may divide and classify an address of the second redundancy row memory cell array into third and fourth sub-addresses, and may divide and classify an address of the third redundancy row memory cell array into fifth and sixth sub-addresses. Therefore, the redundancy select controller 300 may change the first row fuse portion to correspond to the first and third sub-addresses, may change the second row fuse portion to correspond to the fourth and sixth sub-addresses, and may change the third row fuse portion to correspond to the fifth and second sub-addresses.

Hereinafter, a description will be given for a semiconductor device and an operation method thereof according to certain embodiments of the inventive concept with reference to FIGS. 12A and 12B. A semiconductor device 4 of FIG. 12A includes the semiconductor device 3 of FIG. 7 (that is, the embodiment of the semiconductor device 4 is an embodiment of expanding the semiconductor device 3), so not detailed description of the same configurations will be provided.

Figure 12A:
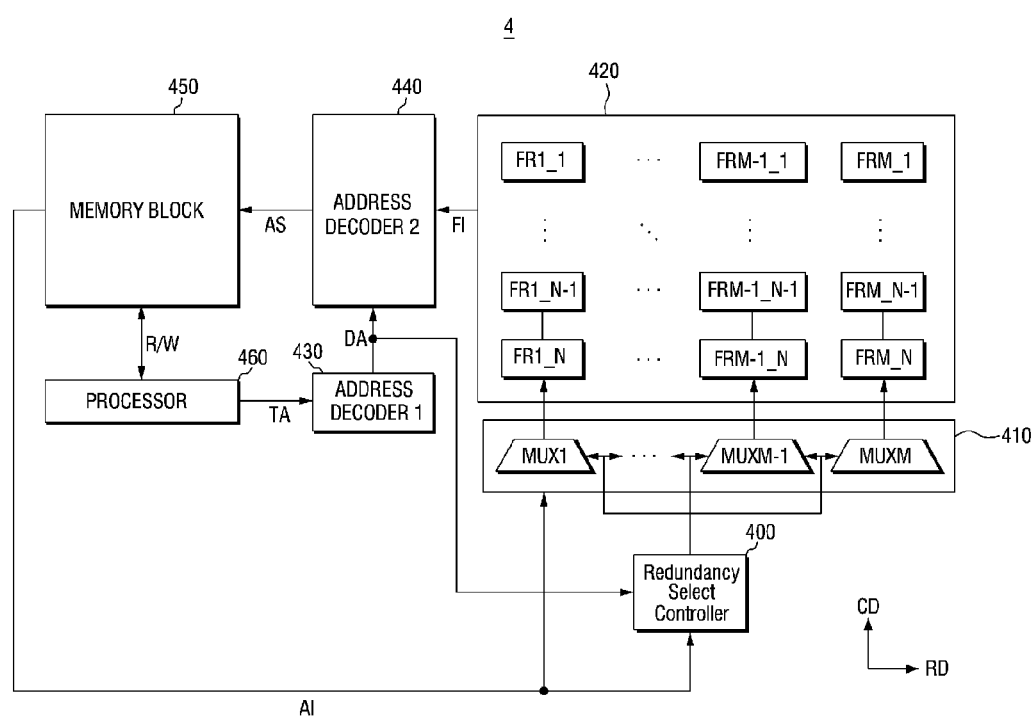
FIG. 12A is a block diagram illustrating a configuration of a semiconductor device according to example embodiments of the inventive concept.

FIG. 12A is a block diagram illustrating a configuration of a semiconductor device according to example embodiments of the inventive concept. FIG. 12B is a flowchart illustrating an operation method of a semiconductor device of FIG. 12A according to example embodiments.

Referring to FIG. 12A, the semiconductor device 4 may include a redundancy select controller 400, a multiplexer 410, a row fuse block 420, a first address decoder 430, a second address decoder 440, a memory block 450, and a processor 460.

Herein, a description for the redundancy select controller 400, the multiplexer 410, and the row fuse block 420 including a plurality of fuse portions was provided in the semiconductor device 3 described above, so no detailed description of the same configurations will be provided.

The first address decoder 430 may receive an address TA of a normal cell array (not shown) included in the memory block 450, which is a target of a read or write operation of the processor 460, from the processor 460 and may decode the received address TA. For example, the memory block 450 may include a normal cell array and a redundancy cell array (e.g., spare cell array). The normal cell array may include a plurality of memory cells and the redundancy cell array may include one or more redundancy column memory cell arrays each including a plurality of spare row memory cells for replacing one or more defective memory cells in the normal cell array for being repaired.

In more detail, the first address decoder 430 may receive the address TA of the normal cell array which is the target of the read or write operation of the processor 460 from the processor 260, may decode the received address TA, and may provide the decoded address DA to the second address decoder 440 and the redundancy select controller 400.

The second address decoder 440 may be connected between the row fuse block 420 and the memory block 450, may receive the decoded address DA and fuse block information FI, and may select the normal cell array or redundancy cell array as a target of a read or write operation of the processor 460.

In certain embodiments, the fuse block information FI may include address information (e.g., row address information of a defective cell) of the defective cell, which is programmed in each of a plurality of row fuse portions included in the row fuse block 420 and information about corresponding relations between the plurality of row fuse portions and the plurality of redundancy row memory cell arrays.

For example, the second address decoder 440 may compare the decoded address DA with an address of a defective cell, which is programmed in the row fuse block 420. As a result of the comparison, when the decoded address DA is identical to the address of the defective cell, which is programmed in the row fuse block 420, the second address decoder 440 may allow a spare word line (SWL) of a redundancy row memory cell array to replace a defective cell among the plurality of redundancy row memory cell arrays to be in an active state. The processor 460 may perform a read or write operation from or in the corresponding redundancy row memory cell. In contrast, as a result of the comparison, when the decoded address DA is different from the address of the defective cell, which is programmed in the row fuse block 420, the second address decoder 440 may allow a word line (WL) of the normal cell array in which the processor 460 wants to perform a read or write operation first to be in an active state. The processor 460 may perform a read or write operation from or in a corresponding address of the normal cell array.

Herein, wanting to allow a spare word line (SWL) of the redundancy row memory cell array or a word line (WL) of the normal cell array to be in an active state, the second address decoder 440 may provide an active signal AS to the memory block 450, that is, the spare row line (SWL) of the redundancy row memory cell array or the word line (WL) of the normal cell array in the memory block 450.

In addition, the redundancy select controller 400 may receive information AI about an address of a redundancy cell array from the memory block 450, that is, the redundancy row memory cell array in the memory block 450, may receive the decoded address DA from the first address decoder 430, and may control corresponding relations between the plurality of row fuse portions and the plurality of redundancy row memory cell arrays based on the received information and address.

A description will be given for an operation method of the semiconductor device 4 of FIG. 12A with reference to FIG. 12B.

Figure 12B:
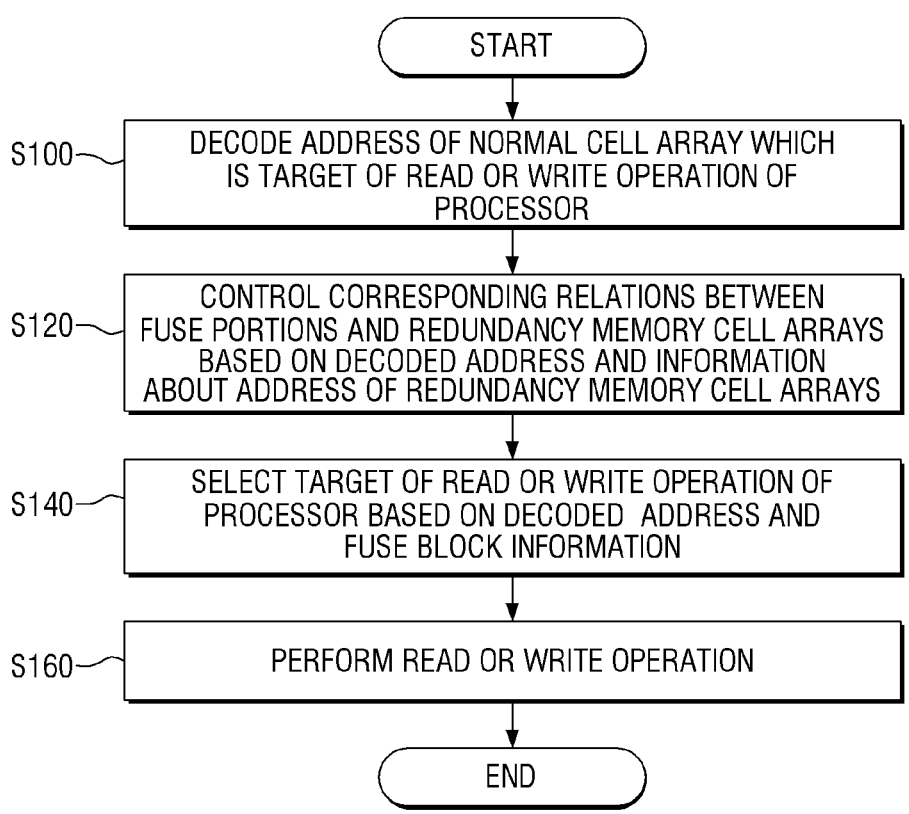
FIG. 12B is a flowchart illustrating an operation method of a semiconductor device of FIG. 12A according to example embodiments.

Referring to FIGS. 12A and 12B, in step S100, an address of a normal cell array which is a target of a read or write operation of a processor may be decoded.

In more detail, the first address decoder 430 may receive the address TA of the normal cell array (not shown) included in the memory block 450, which is a target of a read or write operation of the processor 460, from the processor 460 and may decode the received address TA. Also, the first address decoder 430 may provide the decoded address DA to the second address decoder 440 and the redundancy select controller 400.

In step S120, corresponding relations between fuse portions and redundancy memory cell arrays may be controlled based on the decoded address and information about an address of a redundancy memory cell array.

In more detail, the redundancy select controller 400 may receive information AI about an address of a redundancy row memory cell array from the memory block 450, that is, the redundancy row memory cell array in the memory block 450, may receive the decoded address DA from the first address decoder 430, and may control corresponding relations between the plurality of row fuse portions and the plurality of redundancy row memory cell arrays based on the received information and address.

Information about the corresponding relations between the plurality of row fuse portions and the plurality of redundancy row memory cell arrays, which are controlled by the redundancy select controller 400, may be provided to the second address decoder 440 with the fuse block information FI.

In step S140, a target of a read or write operation of the processor may be selected based on the decoded address and the fuse block information.

In more detail, the second address decoder 400 may receive the decoded address DA and the fuse block information FI and may select the normal cell array or the redundancy cell array as a target of a read or write operation of the processor 460.

For example, the second address decoder 440 may compare the decoded address DA with an address of a defective cell, which is programmed in the row fuse block 420. As a result of the comparison, when the decoded address DA is identical to the address of the defective cell, which is programmed in the row fuse block 420, the second address decoder 440 may allow a spare word line (SWL) of a redundancy row memory cell array to replace a defective cell among the plurality of redundancy row memory cell arrays to be in an active state. In contrast, as a result of the comparison, when the decoded address DA is different from the address of the defective cell, which is programmed in the row fuse block 420, the second address decoder 440 may allow a word line (WL) of the normal cell array in which the processor 460 wants to perform a read or write operation first to be in an active state.

In step S160, a read or write operation may be performed.

In more detail, when the spare word line (SWL) of the redundancy row memory cell array is in the active state, the processor 460 may perform a read or write operation from or in the corresponding redundancy row memory cell array.

In contrast, when the word line (WL) of the normal cell array in which the processor 460 wants to perform the read or write operation is in the active state, the processor 460 may perform a read or write operation from or in a corresponding address of the normal cell array.

Figure 13:
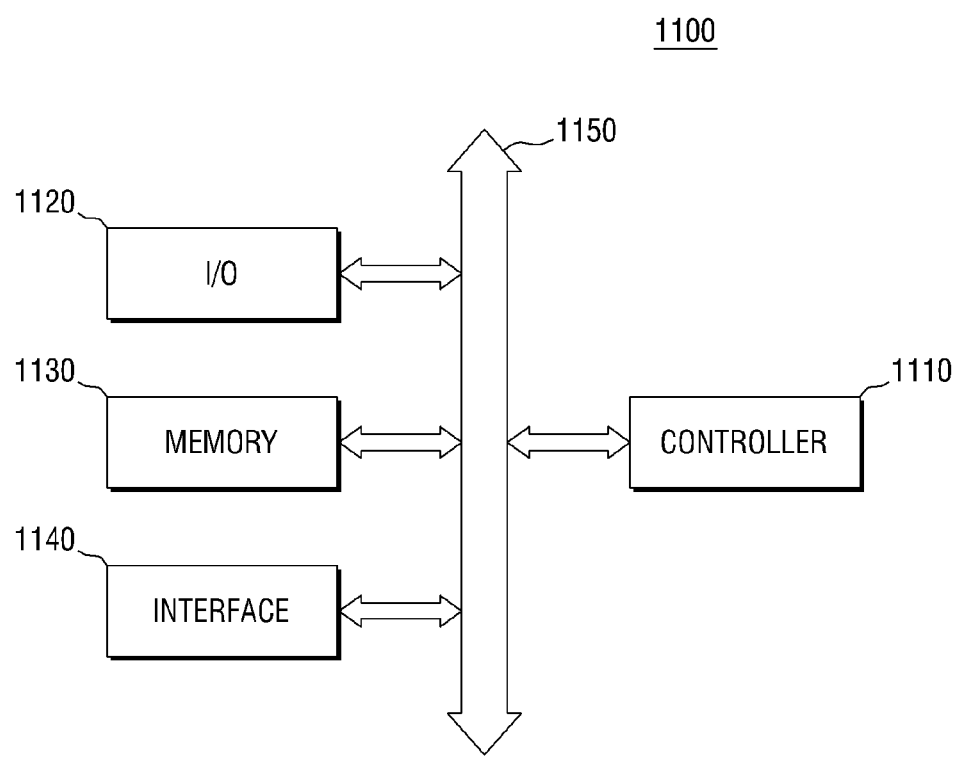
FIG. 13 is a block diagram illustrating a configuration of an electronic device including a semiconductor device according to certain embodiments of the inventive concept.

FIG. 13 is a block diagram illustrating a configuration of an electronic system including a semiconductor device according to certain embodiments of the inventive concept.

Referring to FIG. 13, the electronic system denoted by 1100 according to an exemplary embodiment of the inventive concept may include a controller 1110, an input and output (I/O) device 1120, a memory device 1130, an interface 1140, and a bus 1150. Herein, the controller 1110, the I/O device 1120, the memory device 1130, and/or the interface 1140 may be coupled to each other through the bus 1150. The bus 1150 may correspond to a path in which data are moved.

The controller 1110 may include at least one of a microprocessor, a digital signal processor, a microcontroller, and logic devices which may perform functions which are similar to those of them. The I/O device 1120 may include a keypad, a keyboard, a display device, etc. The memory device 1130 may store data and/or instructions, etc. The interface 1140 may perform a function for transmitting data to a communication network or for receiving data from the communication network. The interface 1140 may have a wired or wireless type. For example, the interface 1140 may include an antenna or a wire and wireless transceiver, etc. Though not illustrated in the drawings, the electronic system 1100 may further include a high speed dynamic random access memory (DRAM) and/or static random access memory (SRAM) which is a dynamic memory for improving an operation of the controller 1110.

Each of semiconductor devices 1 to 4 according to some exemplary embodiments of the inventive concept may be provided in the memory device 1130 or may be provided as a part of the controller 1110, the I/O device 1120, etc.

The electronic system 1100 may be applied to a personal digital assistant (PDA), a portable computer, a web tablet, a wireless phone, a mobile phone, a digital music player, a memory card, or all electronic products which may transmit or receive information in wireless environments.

Figure 14:
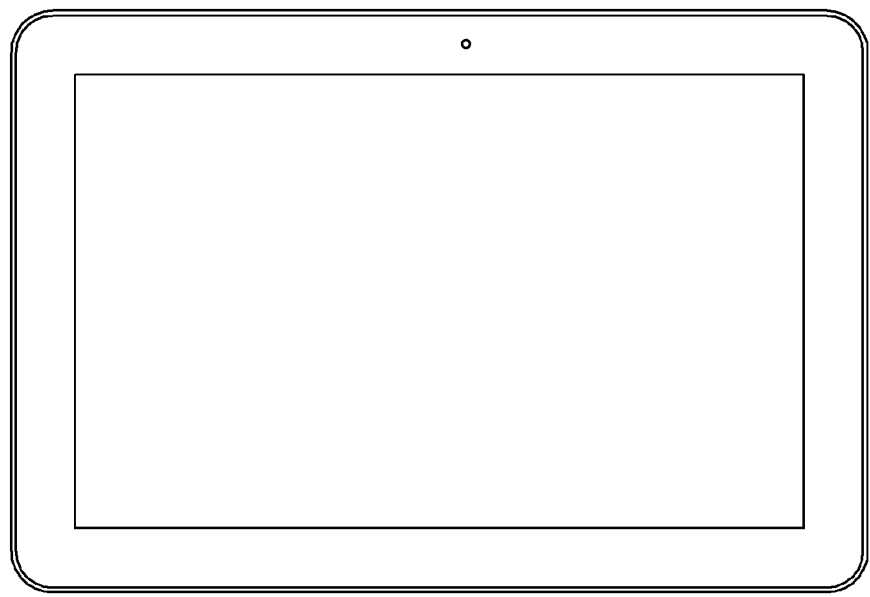
FIGS. 14 to 16 are drawings illustrating exemplary semiconductor systems which may apply semiconductor devices according to certain embodiments of the inventive concept.
Figure 15:
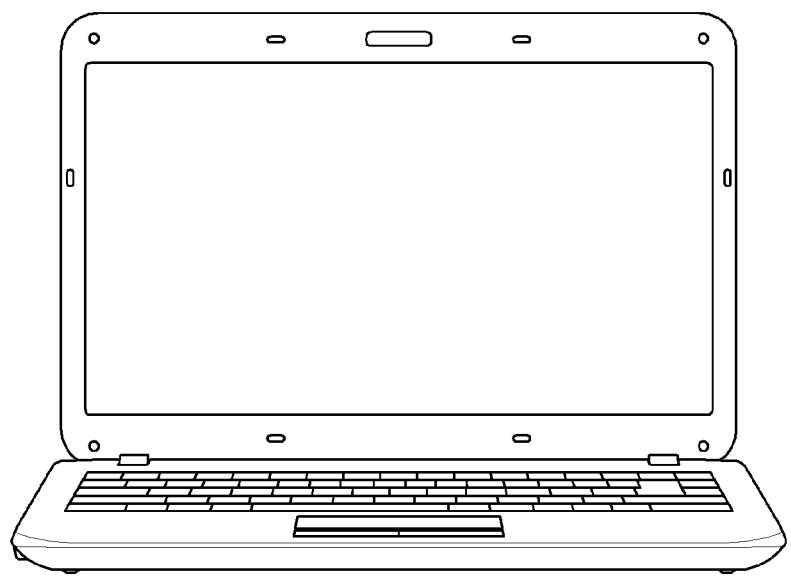
Figure 16:
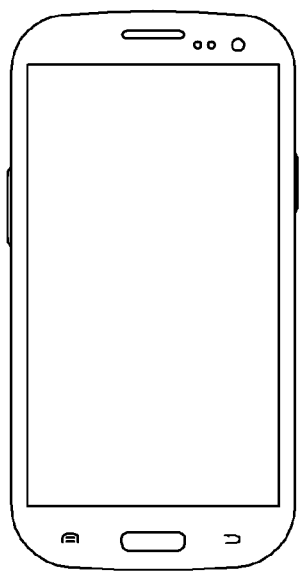

FIGS. 14 to 16 are drawings illustrating exemplary semiconductor systems which may apply semiconductor devices according to certain embodiments of the inventive concept.

FIG. 14 is a drawing illustrating a tablet PC. FIG. 15 is a drawing illustrating a notebook. FIG. 16 is a drawing illustrating a smart phone. Each of semiconductor devices 1 to 4 according to some exemplary embodiments of the inventive concept may be used in the tablet PC 1200, the notebook 1300, the smart phone 1400, etc.

Also, each of semiconductor devices 1 to 4 according to some exemplary embodiments of the inventive concept may be applied to other integrated circuits which are not shown in the drawings. As described above, the tablet PC 1200, the notebook 1300, and the smart phone 1400 are given as examples of the electronic system according to an exemplary embodiment of the inventive concept. However, the examples of the electronic system are not limited to them. In some exemplary embodiments of the inventive concept, the electronic system may be at least one of a ultra mobile PC (UMPC), a workstation, a net-book, a PDA, a portable computer, a wireless phone, a mobile phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, etc.

While the present disclosure has been described with reference to exemplary embodiments, it will be apparent to those skilled in the art that various changes and modifications may be made without departing from the spirit and scope of the disclosure as defined by the appended claims.

What is claimed is:

1. A semiconductor device comprising:
    a first cell array including a plurality of memory cells;
    a plurality of redundancy cell arrays each including a plurality of spare memory cells for replacing one or more defective memory cells in the first cell array, the plurality of redundancy cell arrays comprising a first redundancy cell array and a second redundancy cell array;
    a plurality of fuse portions each configured to store a failed address corresponding to the one or more defective memory cells, the plurality of fuse portions including a first fuse portion and a second fuse portion; and
    a redundancy select controller configured to selectively assign each one of the fuse portions to each one of the redundancy cell arrays, respectively, the redundancy select controller configured to modify a first assignment of the first fuse portion to the first redundancy cell array and the second fuse portion to the second redundancy cell array to a second assignment of the first fuse portion to the second redundancy cell array and the second fuse portion to the first redundancy cell array.

2. The semiconductor device of claim 1, wherein the redundancy select controller is configured to receive address information corresponding to each of the redundancy cell arrays.

3. The semiconductor device of claim 1, wherein the redundancy select controller is configured to divide a plurality of spare memory cells in the first redundancy cell array into first and second sub-addresses corresponding to a first set of spare memory cells and a second set of spare memory cells in the first redundancy cell array, respectively, and divide a plurality of spare memory cells in the second redundancy cell array into third and fourth sub-addresses corresponding to a third set of spare memory cells and a fourth set of spare memory cells in the second redundancy cell array, respectively.

4. The semiconductor device of claim 3, wherein the first and third sub-addresses are stored in a first fuse portion and the second and fourth sub-addresses are stored in a second fuse portion.

5. The semiconductor device of claim 4, wherein the first and third sub-addresses are identical and the second and fourth sub-addresses are identical, and
    wherein the first and second sub-addresses are different from each other and the third and fourth sub-addresses are different from each other.

6. The semiconductor device of claim 1, further comprising:
    a processor configured to perform a read or write operation from or in the first cell array;
    a first address decoder configured to receive a plurality of addresses from the processor and generate a decoded address; and
    a second address decoder configured to receive the decoded address and select the first cell array or one of the redundancy cell arrays as a target of a read or write operation of the processor.

7. The semiconductor device of claim 6, wherein the second address decoder is configured to compare the failed address of the defective memory cell, which is provided from any one of the fuse portions, with the decoded address provided from the first address decoder.

8. The semiconductor device of claim 7, wherein the processor is configured to perform a read or write operation from or in any one of the redundancy cell arrays, when the failed address of the defective memory cell is identical to the decoded address.

9. The semiconductor device of claim 7, wherein the processor is configured to perform a read or write operation from or in the first cell array corresponding to the decoded address, when the failed address of the defective memory cell is different from the decoded address.

10. The semiconductor device of claim 1, further comprising:
a multiplexer connected between the fuse portions and the redundancy select controller,
wherein the redundancy select controller is configured to control corresponding relations between each of the fuse portions and a corresponding redundancy cell array through the multiplexer.

11. The semiconductor device of claim 1, wherein the first redundancy cell array includes a plurality of spare memory cells configured to replace a first defective memory cell in the first cell array,
wherein the second redundancy cell array includes a plurality of spare memory cells configured to replace a second defective memory cell in the first cell array,
wherein the first fuse portion is configured to store a first failed address corresponding to either one or both of the first and second redundancy cell arrays, and
wherein the redundancy select controller is configured to selectively assign the first fuse portion to either one or both of the first and second redundancy cell arrays.

12. A semiconductor device comprising:
a first cell array including a plurality of memory cells arranged in a plurality of rows and columns;
a first set of fuse circuits each fuse circuit configured to store a failed address corresponding to one or more defective memory cells in the first cell array, the first set of fuse circuits including a first fuse circuit and a second fuse circuit;
a first spare cell array including a plurality of spare memory cells configured to replace a first defective memory cell in the first cell array;
a second spare cell array including a plurality of spare memory cells configured to replace a second defective memory cell in the first cell array; and
for replacing the first and second defective memory cells, a redundancy select controller configured to modify a first assignment of the first fuse circuit to the first spare cell array and the second fuse circuit to the second spare cell array to a second assignment of the first fuse circuit to the second spare cell array and the second fuse circuit to the first spare cell array.

13. The semiconductor device of claim 12, wherein an address corresponding to the first defective memory cell is different from an address corresponding to the second defective memory cell.

14. The semiconductor device of claim 12, wherein
the second fuse circuit is configured to store a second failed address corresponding to one or more defective memory cells in the first cell array,
wherein the first spare cell array is further configured to replace a third defective memory cell in the first cell array, and
wherein the second spare cell array is further configured to replace a fourth defective memory cell in the first cell array.

15. The semiconductor device of claim 14, wherein a plurality of spare memory cells of the first spare cell array are arranged in a first column and a plurality of spare memory cells of the second spare cell array are arranged in a second column,
wherein when the redundancy select controller assigns each of the first and second fuse circuits to both of the first and second spare cell arrays,
wherein the first failed address corresponds to a first subset of spare memory cells of the first spare cell array, and
wherein the second failed address corresponds to a second subset of spare memory cells of the first spare cell array.

16. The semiconductor device of claim 14, wherein a plurality of spare memory cells of the first spare cell array are arranged in a first row and a plurality of spare memory cells of the second spare cell array are arranged in a second row,
wherein when the redundancy select controller assigns each of the first and second fuse circuits to both of the first and second spare cell arrays,
wherein the first failed address corresponds to a first subset of spare memory cells of the first spare cell array, and
wherein the second failed address corresponds to a second subset of spare memory cells of the first spare cell array.

17. A semiconductor device comprising:
a first cell array including a plurality of memory cells arranged in a plurality of rows and columns;
a plurality of fuse circuits each configured to store a failed address corresponding to a defective memory cell in the first cell array;
a plurality of spare cell arrays each including a plurality of spare memory cells configured to replace the respective defective memory cell, wherein the plurality of spare memory cells of each of the spare cell arrays are arranged in a first column or in a first row and divided into n subsets of spare memory cells, n is a positive integer; and
a redundancy select controller configured to selectively assign each of the fuse circuits to a corresponding subset of spare memory cells of the n subsets of spare memory cells, respectively.

18. The semiconductor device of claim 17, wherein each set of the n subsets is configured to correspond to each of the failed addresses, respectively, and
wherein the defective memory cells in the first cell array are configured to replace each set of the n subsets.

19. The semiconductor device of claim 17, wherein a first spare cell array of the plurality of spare cell arrays including a plurality of spare memory cells is configured to replace a first defective memory cell in the first cell array,
wherein a second spare cell array of the plurality of spare cell arrays including a plurality of spare memory cells is configured to replace a second defective memory cell in the first cell array,
wherein a first fuse circuit of the plurality of fuse circuits is configured to store a first failed address corresponding to either one or both of the first and second spare cell arrays, and
wherein the redundancy select controller is configured to selectively assign the first fuse circuit to either one or both of the first and second spare cell arrays.

20. The semiconductor device of claim 17, wherein the plurality of fuse circuits include a first fuse circuit and a second fuse circuit, and
wherein the redundancy select controller is configured to modify a first assignment of the first fuse circuit to a first spare cell array of the spare cell arrays and the second fuse circuit to a second spare cell array of the spare cell arrays to a second assignment of the first fuse circuit to the second spare cell array and the second fuse circuit to the first spare cell array.

* * * * *